United States Patent
Ong

(10) Patent No.: US 7,313,740 B2
(45) Date of Patent: Dec. 25, 2007

(54) INTERNALLY GENERATING PATTERNS FOR TESTING IN AN INTEGRATED CIRCUIT DEVICE

(75) Inventor: Adrian E. Ong, Pleasanton, CA (US)

(73) Assignee: Inapac Technology, Inc., San Jose, CA (US)

( * ) Notice: Subject to any disclaimer, the term of this patent is extended or adjusted under 35 U.S.C. 154(b) by 204 days.

(21) Appl. No.: 11/083,473

(22) Filed: Mar. 18, 2005

(65) Prior Publication Data

US 2005/0162182 A1 Jul. 28, 2005

Related U.S. Application Data

(63) Continuation-in-part of application No. 10/205,883, filed on Jul. 25, 2002, now abandoned.

(51) Int. Cl.
*G11C 29/00* (2006.01)
(52) U.S. Cl. .................................. 714/718; 714/733
(58) Field of Classification Search ............... 365/233, 365/201; 714/724, 733, 718
See application file for complete search history.

(56) References Cited

U.S. PATENT DOCUMENTS

| | | | |
|---|---|---|---|
| 4,263,650 A | 4/1981 | Bennett et al. | |
| 4,698,830 A | 10/1987 | Barzilai et al. | |
| 4,743,841 A | 5/1988 | Takeuchi | |
| 4,773,028 A | 9/1988 | Tallman | |
| 4,825,414 A | 4/1989 | Kawata | |
| 4,873,669 A | 10/1989 | Furutani et al. | |
| 5,151,881 A * | 9/1992 | Kajigaya et al. | 365/233 |
| 5,251,095 A | 10/1993 | Miller et al. | |
| 5,271,019 A | 12/1993 | Edwards et al. | |
| 5,301,156 A * | 4/1994 | Talley | 365/201 |
| 5,326,428 A | 7/1994 | Farnworth et al. | |
| 5,388,104 A * | 2/1995 | Shirotori et al. | 714/718 |
| 5,418,452 A | 5/1995 | Pyle | |
| 5,457,400 A | 10/1995 | Ahmad et al. | |
| 5,477,545 A | 12/1995 | Huang | |
| 5,479,105 A | 12/1995 | Kim et al. | |
| 5,499,250 A | 3/1996 | Ingalls et al. | |
| 5,506,499 A | 4/1996 | Puar | |
| 5,523,697 A | 6/1996 | Farnworth et al. | |
| 5,535,165 A | 7/1996 | David et al. | |
| 5,594,694 A | 1/1997 | Roohparvar | |
| 5,604,432 A | 2/1997 | Moore et al. | |
| 5,619,461 A | 4/1997 | Roohparvar | |
| 5,657,284 A | 8/1997 | Beffa | |
| 5,677,885 A | 10/1997 | Roohparvar | |
| 5,719,438 A | 2/1998 | Beilstein et al. | |
| 5,751,015 A | 5/1998 | Corbett et al. | |
| 5,751,987 A | 5/1998 | Mahant-Shetti et al. | |
| 5,801,452 A | 9/1998 | Farnworth et al. | |
| 5,805,609 A | 9/1998 | Mote, Jr. | |
| 5,807,762 A | 9/1998 | Akram et al. | |
| 5,825,697 A | 10/1998 | Gilliam et al. | |

(Continued)

*Primary Examiner*—David Ton
(74) *Attorney, Agent, or Firm*—Sidley Austin LLP

(57) ABSTRACT

In a first integrated circuit chip contained in a single package along with a second integrated circuit chip, a system includes circuitry on the first integrated circuit chip for receiving address signals from the second integrated circuit chip during normal operation. Circuitry on the first integrated circuit chip generates address signals for use in testing the first integrated chip in a test mode.

32 Claims, 14 Drawing Sheets

U.S. PATENT DOCUMENTS

| | | | |
|---|---|---|---|
| 5,825,782 A | 10/1998 | Roohparvar |
| 5,923,600 A | 7/1999 | Momohara |
| 5,925,142 A | 7/1999 | Raad et al. |
| 5,936,260 A | 8/1999 | Corbett et al. |
| 5,959,310 A | 9/1999 | Akram et al. |
| 5,966,388 A | 10/1999 | Wright et al. |
| 5,995,379 A | 11/1999 | Kyougoku et al. |
| 6,011,720 A | 1/2000 | Tanaka |
| 6,026,039 A | 2/2000 | Kim et al. |
| 6,047,393 A | 4/2000 | Yamada |
| 6,069,483 A | 5/2000 | Maxwell et al. |
| 6,072,326 A | 6/2000 | Akram et al. |
| 6,087,676 A | 7/2000 | Akram et al. |
| 6,100,708 A | 8/2000 | Mizuta |
| 6,100,716 A | 8/2000 | Adham et al. |
| 6,104,658 A | 8/2000 | Lu |
| 6,104,664 A | 8/2000 | Ohno |
| 6,137,167 A | 10/2000 | Ahn et al. |
| 6,154,860 A | 11/2000 | Wright et al. |
| 6,157,046 A | 12/2000 | Corbett et al. |
| 6,188,232 B1 | 2/2001 | Akram et al. |
| 6,191,603 B1 | 2/2001 | Muradali et al. |
| 6,194,738 B1 | 2/2001 | Debenham et al. |
| 6,208,157 B1 | 3/2001 | Akram et al. |
| 6,216,241 B1 | 4/2001 | Fenstermaker et al. |
| 6,243,839 B1 | 6/2001 | Roohparvar |
| 6,243,840 B1 | 6/2001 | Raad et al. |
| 6,263,463 B1 | 7/2001 | Hashimoto |
| 6,274,937 B1 | 8/2001 | Ahn et al. |
| 6,286,115 B1 | 9/2001 | Stubbs |
| 6,294,839 B1 | 9/2001 | Mess et al. |
| 6,298,001 B1 | 10/2001 | Lee et al. |
| 6,298,429 B1 | 10/2001 | Scott et al. |
| 6,300,782 B1 | 10/2001 | Hembree et al. |
| 6,310,484 B1 | 10/2001 | Akram et al. |
| 6,320,201 B1 | 11/2001 | Corbett et al. |
| 6,351,681 B1 | 2/2002 | Chih et al. |
| RE37,611 E | 3/2002 | Roohparvar |
| 6,365,421 B2 | 4/2002 | Debenham et al. |
| 6,366,487 B1 | 4/2002 | Yeom |
| 6,392,948 B1 | 5/2002 | Lee |
| 6,395,565 B1 | 5/2002 | Akram et al. |
| 6,396,291 B1 | 5/2002 | Akram et al. |
| 6,407,566 B1 | 6/2002 | Brunelle et al. |
| 6,441,479 B1 | 8/2002 | Ahn et al. |
| 6,445,625 B1 | 9/2002 | Abedifard |
| 6,456,099 B1 | 9/2002 | Eldridge et al. |
| 6,470,484 B1 | 10/2002 | Day et al. |
| 6,472,747 B2 | 10/2002 | Bazarjani et al. |
| 6,483,760 B2 | 11/2002 | Kang |
| 6,484,279 B2 | 11/2002 | Akram |
| 6,502,215 B2 | 12/2002 | Raad et al. |
| 6,507,885 B2 | 1/2003 | Lakhani et al. |
| 6,519,171 B2 | 2/2003 | Matsuzaki et al. |
| 6,519,725 B1 | 2/2003 | Huisman et al. |
| 6,675,269 B2 | 1/2004 | Miura et al. |
| 6,708,264 B1 | 3/2004 | Abe et al. |
| 6,711,042 B2 | 3/2004 | Ishikawa |
| 6,791,175 B2 | 9/2004 | Matsuo et al. |
| 6,801,461 B2 * | 10/2004 | Hii et al. ..................... 365/201 |
| 6,825,683 B1 | 11/2004 | Berndt et al. |
| 6,996,754 B1 * | 2/2006 | Lee .......................... 714/724 |
| 2002/0017720 A1 | 2/2002 | Nishizawa et al. |
| 2002/0117729 A1 | 8/2002 | Aiki et al. |
| 2003/0235929 A1 | 12/2003 | Cowles et al. |
| 2004/0027150 A1 | 2/2004 | Miura et al. |
| 2004/0100296 A1 | 5/2004 | Ong |
| 2004/0150089 A1 | 8/2004 | Inoue et al. |
| 2004/0196709 A1 | 10/2004 | Ong |
| 2004/0232559 A1 | 11/2004 | Adelmann |

* cited by examiner (DEFAULT S=1 ON POWER UP)

(DEFAULT S=0 ON POWER UP)

INTERNALLY GENERATING PATTERNS FOR TESTING IN AN INTEGRATED CIRCUIT DEVICE

CROSS-REFERENCE TO RELATED APPLICATION

The present application is a continuation-in-part of U.S. patent application Ser. No. 10/205,883, filed on Jul. 25, 2002 now abandoned, the entirety of which is incorporated by reference herein.

FIELD OF THE INVENTION

The current invention relates to the integrated circuits (IC) devices, and in particular, internally generating patterns for testing in an integrated circuit device.

BACKGROUND OF THE INVENTION

In the field of integrated circuit (IC) devices, several semiconductor die (commonly referred to as "chips") can be combined into a single protective package. In some applications, such as that disclosed in U.S. patent application Ser. No. 09/666,208 filed on Dec. 21, 2000, entitled "Chip Testing Within a Multi-Chip Semiconductor Package," which is assigned to the same assignee and incorporated by reference herein, a memory chip can be combined with a larger chip to provide both the functions of processing and storage of data. In such a combination, the number of external pins available for interacting with the logic or memory chips may be less than that which would be used if the two chips were packaged separately. Accordingly, there is a reduction in the overall number of external pins available for access to and from the chips.

It is important that packaged semiconductor devices be tested for quality before such devices are made available or sold to a customer. In the situation of multiple chips incorporated into a single package, testing can be made more complex if there is a reduction in the overall number of external pins. This is because many signals conveying patterns and addresses for use in testing are typically applied through external pins.

SUMMARY OF THE INVENTION

The present invention provides, in various embodiments, system and methods for internally generating test data and addresses within an integrated circuit device for testing of the same. Internal generation of such patterns is beneficial, especially in the context of multiple chips placed into a single package with reduction in external pin count.

In accordance with an embodiment of the present invention, in a first integrated circuit chip contained in a single package along with a second integrated circuit chip, a system includes circuitry on the first integrated circuit chip operable to receive address signals from the second integrated circuit chip during normal operation. Circuitry on the first integrated circuit chip is operable to generate address signals for use in testing the first integrated chip in a test mode.

In accordance with another embodiment of the present invention, in a semiconductor device having a first integrated circuit chip and a second integrated circuit chip contained in a single package, wherein the first integrated circuit chip and the second integrated circuit chip share a plurality of external pins of the single package, the first integrated circuit chip includes circuitry for receiving address signals from the second integrated circuit chip during normal operation for the first integrated circuit chip. A first latching component receives and latches a value for an initial address in a test mode for the first integrated circuit chip. A test address counter, coupled to the latching component, generates a sequence of addresses in the test mode, wherein the sequence of addresses is represented by respective values which are derived by incrementing or decrementing from a value for an initial address.

Important technical advantages of the present invention are readily apparent to one skilled in the art from the following figures, descriptions, and claims.

BRIEF DESCRIPTION OF THE DRAWINGS

For more complete understanding of the present invention and for further features and advantages, reference is now made to the following description taken in conjunction with accompanying drawings, in which.

DETAILED DESCRIPTION OF THE PREFERRED EMBODIMENTS

The preferred embodiments of the present invention and their advantages are best understood by referring to FIGS. 1 through 15 of the drawings. Like numerals are used for like and corresponding parts of the various drawings.

Figure 1:
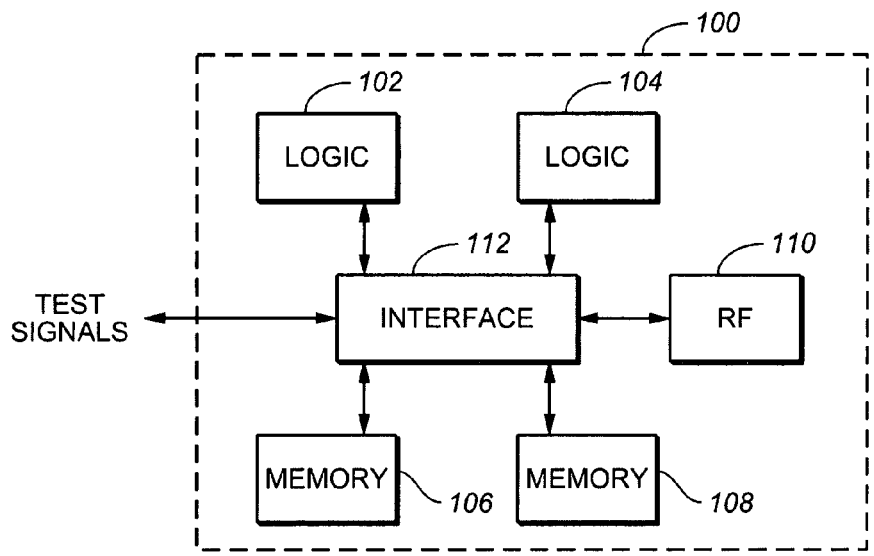
FIG. 1 illustrates an architecture in which embodiments of the present invention may be used.

FIG. 1 illustrates an architecture 100 in which embodiments of the present invention may be used. As depicted, architecture 100 may include a number of components such as logic components 102 and 104, memory components 106 and 108, radio-frequency (RF) component 110, and interface component 112. Each of logic components 102 and 104, memory components 106 and 108, and radio-frequency (RF) component 110 can be implemented in a separate semiconductor die (commonly referred to as a "chip"). Each die is a monolithic structure formed from, for example, silicon or other suitable material. The die or chips of architecture 100 can be incorporated in a single semiconductor package or module. Accordingly, architecture 100 can be for a multi-chip module (MCM) or a multi-chip package (MCP).

Architecture 100 can be packaged as a standard ball grid array (BGA) or thin quad flatpack (TQFP) having, for example, 144 pins or more. However, other types of packaging may be used. For example, the packaging may have a ceramic base with wire bonding or employing thin film substrates, and mounting on a silicon substrate or a printed circuit board (PCB) substrate. The packaging may further utilize various surface mount technologies such as a single in-line package (SIP), dual in-line package (DIP), zig-zag in-line package (ZIP), plastic leaded chip carrier (PLCC), small outline package (SOP), thin SOP (TSOP), flatpack, and quad flatpack (QFP), to name but a few, and utilizing various leads (e.g., J-lead, gull-wing lead) or BGA type connectors. It should also be understood that the systems, apparatuses, and methods of the present invention are not limited by the type of chip packaging and is applicable for any type of chip or multi-chip semiconductor packaging.

Each of logic components 102 and 104 can be a chip with logic circuitry, such as, for example, an application specific integrated circuit (ASIC), a processor, a microprocessor, a microcontroller, a field programmable gate array (FPGA), programmable logic device (PLD), complex programmable logic device (CPLD), or other logic device. Each of memory components 106 and 108 can be an IC memory chip, such as, for example, static random access memory (SRAM), dynamic random access memory (DRAM), synchronous DRAM (SDRAM), non-volatile random access memory (NVRAM), and read only memory (ROM), such as erasable programmable ROM (EPROM), electrically erasable programmable ROM (EEPROM), and flash memory. RF component 110 may be a chip comprising circuitry for providing or supporting RF communication (e.g., wireless) for architecture 100. RF component 110 may include circuitry for receiving and transmitting signals via RF.

Interface component 112 generally functions as an interface for the other components in architecture 100. In one embodiment, interface component 112 can be implemented on a semiconductor chip which is separate (i.e., stand-alone) from the other components in architecture 100. Alternatively, interface component 112 can be implemented, in whole or in part, on one or more of the chips for logic components 102 and 104, memory components 106 and 108, and radio-frequency (RF) component 110. Interface component 112 may implement one or more buses through which data, address, and/or control information can be communicated between and among the other components of architecture 100, as well as externally.

Interface component 112 may comprise various blocks or circuitry for communicating between and among logic components 102 and 104, memory components 106 and 108, and radio-frequency (RF) component 110, as well as externally of the packaging. These blocks or circuitry may include one or more test data (TDQ) buffers and data control circuits; data TOPO scramble block, parallel compression block or TPDRs; individual data (DQ) selection block; test mode register block (array of test signals and vector generation circuits); row/column test counter; test input control block; signal interface monitor block; fuse ID block; memory controller with on-chip cache; and self-adjusting drive strength using on-chip voltage/process monitor circuit. Some of these are described in related patents and patent applications U.S. Pat. No. 6,732,304; U.S. Pat. No. 6,754,866; U.S. Pat. No. 6,812,726; U.S. patent application Ser. No. 10/205,883, filed on Jul. 25, 2002; U.S. patent application Ser. No. 10/679,673, filed on Oct. 3, 2003; U.S. patent application Ser. No. 10/824,734, filed on Apr. 14, 2004; U.S. patent application Ser. No. 10/967,749, filed on Oct. 18, 2004; the entireties of which are incorporated by reference herein.

Any or all of logic components 102 and 104, memory components 106 and 108, radio-frequency (RF) component 110, and interface component 112 of architecture 100 represent any type of integrated circuit (IC) device or chip that may require testing, such as, for example, by external automated test equipment or an integrated circuit tester. For this testing, various test signals may be communicated through, for example, interface component 112. These test signals may include TEST, SET, and LOAD signals, various command signals (e.g., CMD1, CMD2, CMD3, and CMD4), test clock and enable signals (e.g., TCLK and TCKE), test data signals (e.g., TDQ[0:7], or simply TD[0:7]), and analog signals (e.g., AN[0:4]).

Figure 2:
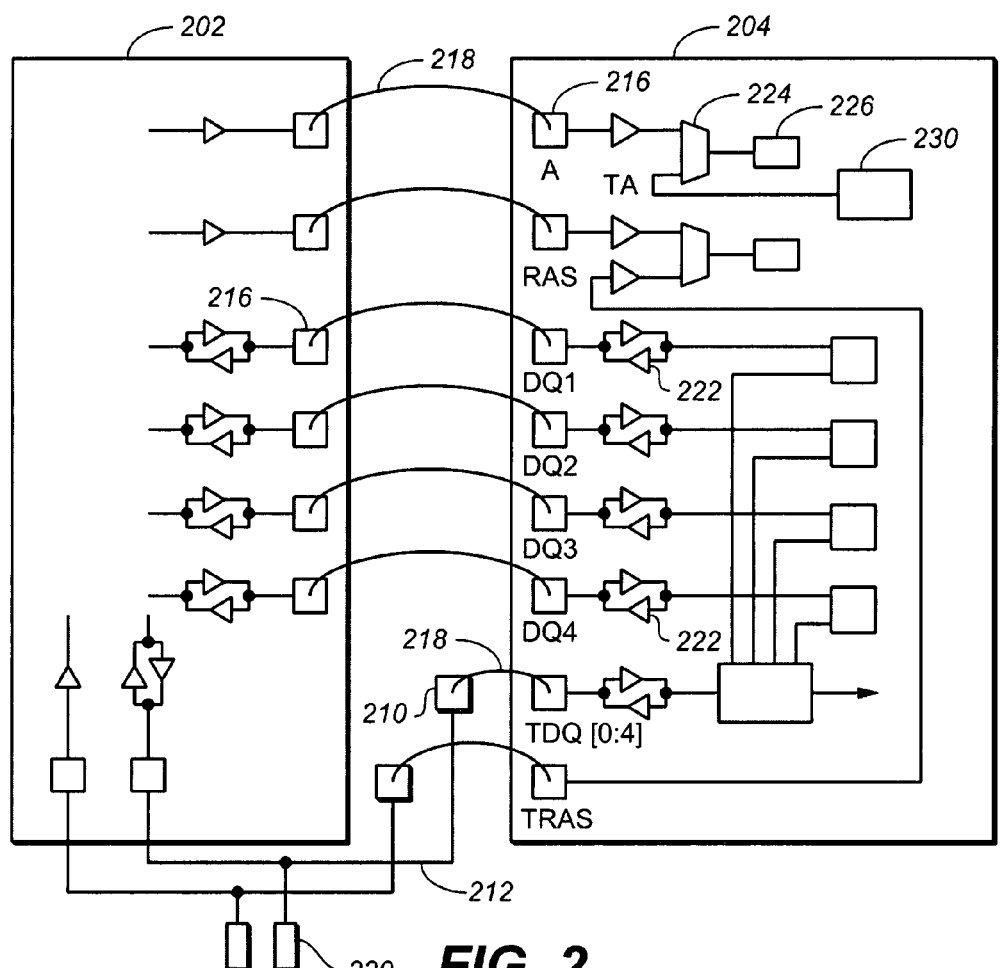
FIG. 2 is a high-level block diagram of two exemplary semiconductor chips, according to an embodiment of the present invention.

FIG. 2 is a high-level block diagram of two exemplary semiconductor chips 202 and 204, according to an embodiment of the present invention. Semiconductor chips 202 and 204 can be contained or incorporated in the same semiconductor package or module. Systems and methods, according to various embodiments of the invention, can be incorporated and used in chips 202 and 204.

Semiconductor chips 202 and 204 represent any type of integrated circuit (IC) devices that may require testing, such as, for example, by external automated test equipment or an integrated circuit tester. For example, chips 202 and 204 can be each be one of, in whole or in part, logic components 102 and 104, memory components 106 and 108, radio-frequency (RF) component 110, and interface component 112 of architecture 100 as shown in FIG. 1. In one embodiment, chip 202 can be a system chip (such as a logic component of FIG. 1) and chip 204 can be a memory chip (such as a memory component of FIG. 1).

In one embodiment, chips 202 and 204 may be mounted in a side-by-side arrangement on a printed circuit board (PCB) substrate, such as for a multi-chip package (MCP). Such PCB substrate may also have substrate pads 210 and traces 212.

Semiconductor chips 202 and 204 may each comprise one or more bond pads 216, which can be connected via, for example, bonding wires 218, to provide communication between the chips and/or other components within or external to the package. As used herein, the terms "connected," "coupled," or any variant thereof, means any connection or coupling, either direct or indirect, between two or more elements. For clarity, in FIG. 2, only a portion of the bond pads 216 and bonding wires 218 are provided with reference numerals.

A number of external terminals 220 are provided, which can be, for example, input/output (I/O) leads or pins. For clarity, in FIG. 2, only some of the external terminals 220 are provided with reference numerals. External terminals 220 may be connected to substrate pads 210 and traces 212 on the substrate, or directly to bond pads 216 on chips 202 and 204. In general, these external terminals 220 enable the components within semiconductor chips 202 and 204 to exchange data/information with components external to the package in which these chips are contained. In one embodiment, one or more of these external terminals 220 may be connected to and serve both semiconductor chips 202 and 204. That is, a terminal 220 which provides I/O capability for the chip 202 may also provide I/O capability for the chip 204.

Chips 202 and 204 (contained in a single package) can work in normal operation or be placed in a test mode. In normal operation, signals are exchanged between chip 202 and chip 204, and the chips may cooperate to receive, process, store, and output data and information. In test mode, one or both of chips 202 and 204 may be functionally tested within the package to verify proper operation. With embodiments of the present invention, chip 202 can be tested completely separately from chip 204, and vice versa. During test mode, in some embodiments, signals may be monitored and "read" out of chip 202 or 204. For chip 204, the signals for test mode may originate from external test equipment or be generated internally.

In one embodiment, during normal operation, signals are communicated between chips 202 and 204. These signals can be, for example, clock (CLK), clock enable (CKE), row address strobe (RAS), column address strobe (CAS), write enable (WE), chip select (CS), address (A[0:11]), data (DQ[0:31], or simply D[0:31]), and bank address (BA0,1). At least some of the bond pads 216 and bonding wires 218 may support this communication directly between chips 202 and 204. Such bond pads 216 can be considered chip-to-chip (or die-to-die) bond pads 216. Referring to FIG. 2, these die-to-die bond pads 216 on chip 204 correspond to the bonding wires 218 extending between the chips and marked with, for example, "A" (representing address signals communicated between chip 202 and chip 204), "RAS" (representing command signals communicated between chip 202 and chip 204), and "DQ" (representing data signals communicated between chip 202 and chip 204). These bond pads 216 on chip 204 are not "seen" or directly accessible externally of the package.

In test mode, signals may be provided to chip 202 or 204 from test equipment that is external to package. For this purpose, some of bond pads 216 on memory chip 204 are directly accessible externally of the package. Such bond pads 216 may be considered "shared" with chip 202 because these bond pads 216 on the chip 204 are connected to some of the same traces 212 and external terminals 220 as bond pads 216 on chip 202. In one embodiment, these shared bond pads 216 on chip 204 can be for signals that are used for testing chip 204. Such signals can include, for example, TEST, SET, LOAD, test clock (TCLK), test clock enable (TCKE), test row address strobe (TRAS), test column address strobe (TCAS), test write enable (TWE), test chip select (TCS), test data (TDQ[0:7], or simply TD[0:7]), and test bank address (TBA0,1). Referring to FIG. 2, these shared bond pads 216 are marked with, for example, "TRAS" (representing command signals communicated to chip 204 from externally), and "TDQ" (representing data signals communicated to chip 204 from externally). In test mode, the chip-to-chip bond pads 216 may be tri-stated so that signals from chip 202 are not inadvertently used during testing of chip 204, and vice versa.

In one embodiment, chip 204 can be placed in a test mode with various control signals, such as, for example, the TEST, SET, and LOAD signals. In some embodiments, the TEST signal is made a high value (or "1", such as VDD) and remains high throughout in-package testing. The SET and LOAD signals are initially at a low value (or "0", such as GND). Then the SET and LOAD signals are pulsed high for predetermined periods (e.g., 10 ns) to enable various circuitry on chip 204 for testing.

In some embodiments, test mode may be desirable if power and ground pins for the package (and/or traces 212 in the PCB substrate) are shared between the chips 202 and 204. In other embodiments, if separate power planes are provided for each of chips 202 and 204, then a test mode may not be used.

One or more external terminals 220 may be dedicated (i.e., not shared between chips 202 and 204) for testing of memory chip 204. In one embodiment, these dedicated terminals 220 can receive signals for test (TEST), analog word-line voltage (VCCP), and analog memory substrate voltage (VBB). The TEST signal generally functions to put chip 204 in test mode. The VCCP and VBB signals are used for stressing the chip 204 by providing voltage levels significantly above or below VDD and VSS. In another embodiment, only one external terminal 220—i.e., the one for the TEST signal—is dedicated for the testing of chip 204, and the signals for VCCP and VBB are generated internally within chip 204. This reduces pin count for the package. In yet another embodiment, the external terminal 220 which receives the TEST signal may be shared between the chips 202 and 204. In such case, a voltage level which differs from the voltage levels used in normal operation is applied to the external terminal to put the memory chip 204 into test mode.

Each of chips 202 and 204 may include other circuitry for normal operation or test mode. Chip 204 in particular may include one or more input and/or output buffers 222, multiplexers 224, registers 226, pattern generator circuitry 230, and other circuitry. Buffers 222 are connected to bond pads 216, and may buffer signals to and from chip 202 (in normal operation) or external test equipment (in test mode). Pattern generator circuitry 230 generally functions to generate patterns which are used for testing the chip 204 in test mode. Such pattern generator circuitry 230 may function to internally generate sequences of numbers for use as addresses (e.g., TA) during testing. Multiplexers 224 generally function to multiplex between signals that are used in normal operation and signals that are used in test mode. Each multiplexer 224 may have one input terminal connected to a buffer 222 that provides signaling for normal operation (e.g., DQ[0:4], RAS, or A) and another input terminal connected circuitry that provides signaling for test mode (e.g., TDQ[0:4], TRAS, or TA). The output of multiplexers 224 depends on whether chip 204 is in normal operation or test mode.

If chip 204 were packaged as a discrete component (i.e., separate from chip 202), thorough testing of the chip 204 would require full access to all data, control, and access points of the chip so that complete test patterns could be input and extracted from the chip 204. But since chip 204 is packaged with chip 202 in a single package and various access points of chip 204 are connected to chip 202 for normal operation, multiplexers 224 enable full access to chip 204 by multiplexing between signals from chip 202 in normal operation and signals from external test equipment (or generated internally) during test mode. In this way, the external terminals 220 which are shared between the chips 202 and 204 can imitate test pins which would be dedicated if chip 204 were packaged separately.

Figure 3:
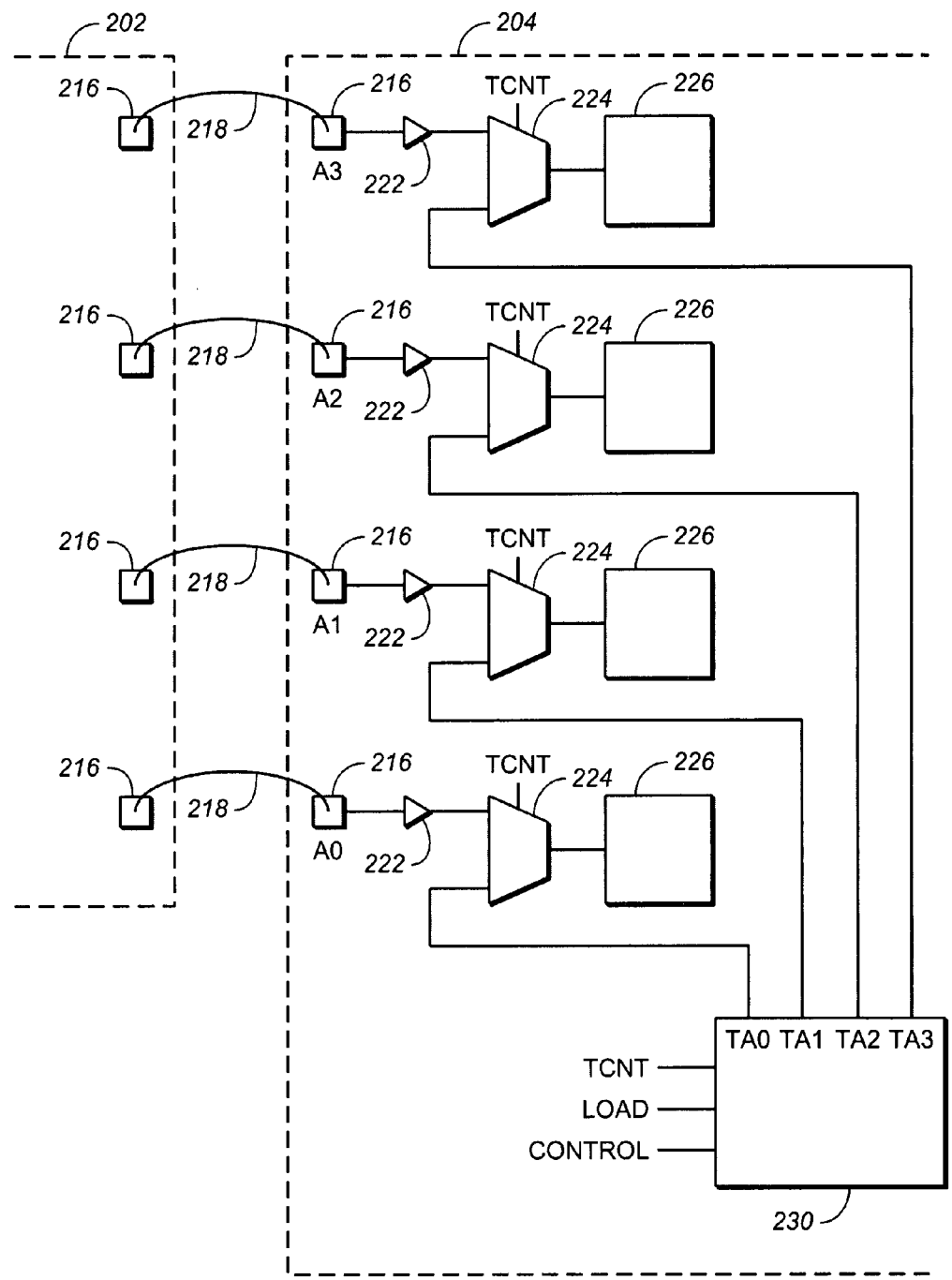
FIG. 3 is another high-level block diagram of two exemplary semiconductor devices, according to an embodiment of the present invention.

FIG. 3 is another high-level block diagram of two exemplary semiconductor chips 202 and 204, according to an embodiment of the present invention. FIG. 3 shows additional details for circuitry that is used for address signaling for normal operation and test mode in chip 204. As depicted, this circuitry includes one or more bond pads 216, input buffers 222, multiplexers 224, registers 226, and pattern generator circuitry 230 on chip 204.

Bond pads 216 and buffers 222 on chip 204 receive address signals A[0:3] from chip 202 via bonding wires 218. These address signals A[0:3] (i.e., A0, A1, A2, and A3) are generated by chip 202 and provided to chip 204 during normal operation.

Pattern generator circuitry 230 receives a start test counter (TCNT), LOAD, and one or more other control signals. Pattern generator circuitry 230 generates sequences of numbers for use as addresses in test mode for chip 204. These addresses are conveyed in test address signals TA[0:3] (i.e., TA0, TA1, TA2, and TA3) which are output from pattern generator circuitry 230. In one embodiment, SET and LOAD signals are used to cause information for a least significant bit (LSB), increment or decrement, and initial address to be loaded into pattern generator circuitry 230. Next, LOAD and TCNT signals are used to start the internal generation of sequences to be used as addresses by pattern generator circuitry 230.

Multiplexers 224 each have one input terminal connected to a buffer 222 that provides address signals for normal operation (i.e., A[0:3]) and another input terminal connected to pattern generator circuitry 230 that provides address signals for test mode (i.e., TA[0:3]). Multiplexers 224 function to multiplex between the signals that are used in normal operation and the signals that are used in test mode. Multiplexers 224 may be controlled or enabled with the TCNT signal. If chip 204 is in normal operation (TCNT signal has one value, such as, for example, "low"), multiplexers 224 will output the address signals A[0:3]. If chip 204 is in test mode (TCNT signal has another value, such as, for example, "high"), multiplexers 224 will output the test address signals TA[0:3].

Address registers 226 receive and store the output from multiplexers 224 for use as addresses during normal operation or in test mode.

Figure 4:
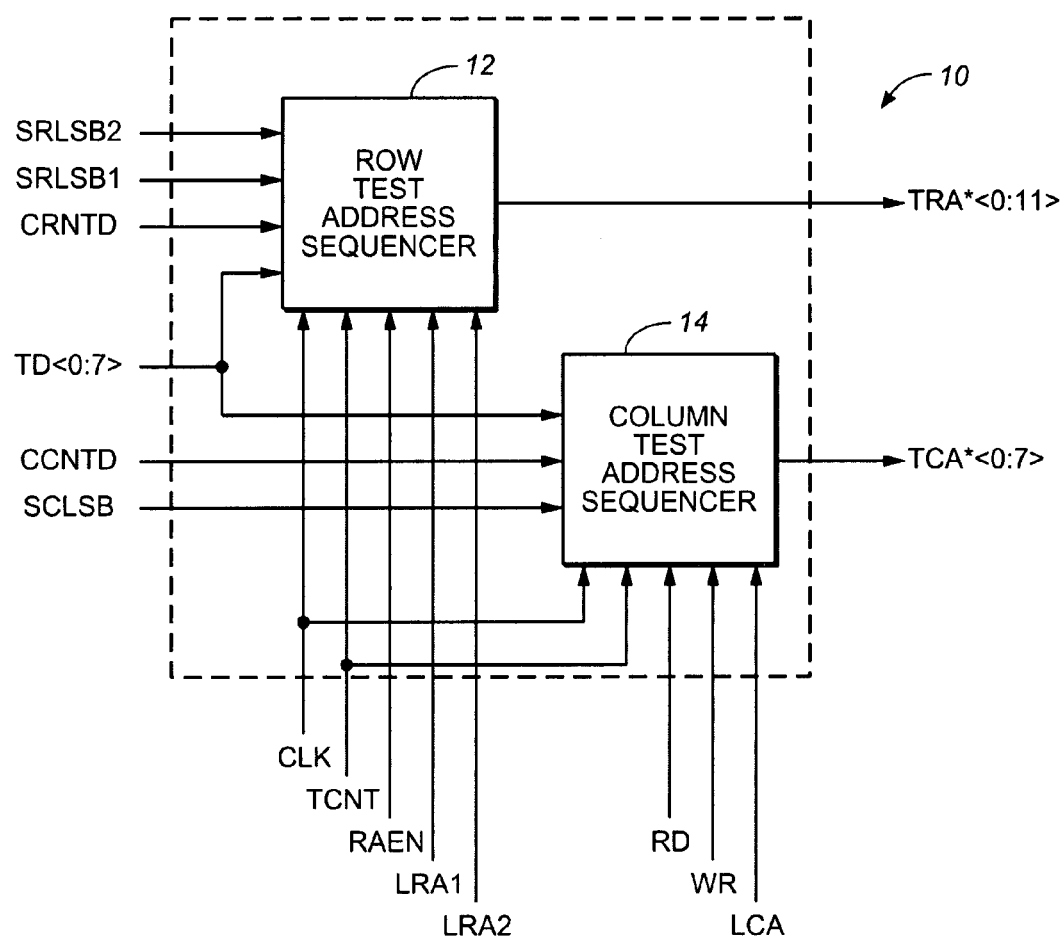
FIG. 4 illustrates a circuitry for internally generating patterns for testing, according of an embodiment of the present invention.

FIG. 4 illustrates a system 10 for internally generating patterns for testing, according of an embodiment of the present invention. In one embodiment, system 10 can be an implementation for pattern generator circuitry 230 shown and described with reference to FIGS. 2 and 3 above.

System 10 may be implemented and incorporated on an integrated circuit (IC) "chip," which can be a monolithic semiconductor structure or die formed from, for example, silicon or other suitable material. Such chip can be a dynamic random access memory (DRAM), synchronous DRAM (SDRAM), static RAM (SRAM), non-volatile RAM (NVRAM), programmable read only memory (PROM), erasable programmable ROM (EPROM), electrically erasable programmable ROM (EEPROM), flash memory, or any other suitable memory chip. The chip could also be field programmable gate array (FPGA), programmable logic device (PLD), application specific integrated circuit (ASIC), a microprocessor, a microcontroller, or a digital signal processor (DSP), or other suitable logic chip. The chip on which circuitry 10 is incorporated can be packaged by itself or it can be one chip in a package containing multiple chips.

Integrated circuit memory implemented in memory chips (or embedded in logic chips) is typically made up of a number of memory locations or cells. These cells are physically arranged in rows and columns. Each memory cell has a respective "column address" and "row address" which uniquely identifies its location. The row and column addresses can be numerical values. For example, a row address can be a 12-bit binary number, and a column address can be an 8-bit binary number. Row and column addresses are provided to peripheral circuitry located on memory chips in order to access the memory cells for input and retrieval (writing/reading) of data or information.

System 10 generally functions to generate patterns to be used in testing of the integrated circuit device (or chip) on which it is incorporated. These patterns can be sequences of data or addresses to be used during testing. For clarity, the remainder of this description primarily discusses embodiments of system 10 (and related methods and apparatuses) wherein the sequences are used as addresses, but it should be understood that the invention is not so limited. Such address sequences may comprise one or more addresses for various cells in one or more memory arrays, such as may be found in a memory chip or logic chip with embedded memory. The address sequences may be provided to peripheral circuitry for access to the appropriate memory cells. System 10 is advantageous because the row and column addresses for memory cells are internally generated with the chip, and thus no external pins are required for supporting the provision of addresses to the chip during testing.

As depicted, system 10 may include a row test address sequencer 12 and a column test address sequencer 14. These test address sequencers 12 and 14 may function to generate sequences of addresses for rows and columns, respectively. In some embodiments, these sequences of addresses can be essentially incrementing or decrementing values from an initial value. That is, each of test address sequencers 12 and 14 may "count up" or "count down" from some respective initial values, for example, in increments or decrements of 1, 2, 4, 8, etc.

Row test address sequencer 12 may receive information for an initial row address, a least significant bit (LSB) in the initial row address, and increment up (or decrement down). In one embodiment, as shown in FIG. 4, this information is conveyed to row test address sequencer 12 using a number of signals including, for example, test data (TDQ[0:7], or simply TD[0:7]), set row least significant bit 1 (SLRSB1), set row least significant bit 2 (SRLSB2), and a count row down (CRNTD). That is, TD[0:7] signal may convey information or data for an initial value (or row address). The CRNTD signal may convey information or data for causing the row test address sequencer to count up (increment) or count down (decrement) from the initial value. The TD[0:7] signal and the SRLSB1, SRLSB2 signals may convey information or data for defining a least significant bit (LSB) in the initial value. The size of increments or decrements (e.g., 1, 2, 4, etc.) as row test address sequencer 12 counts depends on which bit in the initial value is defined as the LSB.

The information for initial row address, LSB, and increment up (or decrement down) can be loaded into row test address sequencer 12 using the command signals SET and LOAD. In some embodiments, an initial row address can have more bits than the number of test data TD signals which are available for conveying information for the same. In this case, more than one load using the test data TD signals can be performed in order to extend the bits for the initial address. For example, if the initial row address is represented by sixteen (16) bits but only eight test data TD signals are available for loading, then two load operations can be performed. The row test address sequencer 12 may receive a first load row address (LRA1) signal and a second load row address (LRA2) signal. The first load row address (LRA1) signal triggers or enables the first load operation, in which the first eight bits of the initial row address are loaded into system 10. The second load row address (LRA2) signal triggers or enables the second load operation, in which the next eight bits of the initial row address are loaded.

After information is loaded into the row test address sequencer 12, the generation of sequences (or row addresses) is started, for example, using the start test counter (TCNT) signal. The TCNT signal may be loaded through test mode using, for example, SET and LOAD signals. The row test address sequencer can receive a row address enable (RAEN) signal. In one embodiment, row test address sequencer 12 may receive a clock (CLK) signal for synchronous designs; in other embodiments, no clock signal is needed for asynchronous designs. Row test address sequencer 12 outputs a test row address (TRA[0:11]) signal which may be applied to a row address buffer for a memory array. The TRA[0:11] signal may convey a sequence of values (corresponding to row addresses) which can be used to access memory cells at particular rows in the memory array.

Column test address sequencer 14 can operate similar to row test address sequencer 12. Column test address sequencer 14 may receive information for an initial row address, a least significant bit, and increment up (or decrement down). In one embodiment, this information is conveyed to row test address sequencer 12 using a number of signals including, for example, the test data TD[0:7], a count column down (CCNTD), and a set column least significant bit (SCLSB). The TD[0:7] signal may convey information or data for an initial value (or column address). The CCNTD signal may convey information or data for causing the column test address sequencer to count up or count down from the initial value. The TD[0:7] signal and the SCLSB signals may convey information or data for defining a least significant bit (LSB) in the initial value. The size of increments or decrements (e.g., 1, 2, 4, etc.) as column test address sequencer 14 counts depends on which bit in the initial value is defined as the LSB. The information for initial row address, LSB, and increment up (or decrement down) can be loaded into column test address sequencer 14 using the SET and LOAD signals. A load column address (LCA) signal may be used to trigger or enable the operation to load the initial column address.

After information is loaded into the column test address sequencer 14, the generation of sequences (or column addresses) is started, for example, using the start test counter (TCNT) signal. Column test address sequencer 14 also received the CLK signal, a read (RD) signal, and a write (WR) signal. Column test address sequencer 14 may output a test column address (TCA[0:7]) signal which may be applied to a column address buffer for a memory array. The TCA[0:7] signal may convey a sequence of values (corresponding to column addresses) which can be used to access memory cells at particular columns in the memory array.

In one embodiment, the test column addresses of the TCA[0:7] signal may be output from column test address sequencer 14 to simulate burst operations. In a burst operation, the data at a plurality of sequential column addresses are accessed in response to a single read (RD) or write (WR) command, thus enabling more rapid access of the data. For a burst operation, only the first column address is needed in order to access the group of column addresses. The number of columns accessed by a single burst operation is referred to as the burst length. For example, if eight columns are accessed in burst operation, the burst length is eight, and only the address of the first column is needed in order to access data from all eight columns. To simulate burst operation for the IC chip on which system 10 is contained, column test address sequencer 14 may output test column addresses in accordance with a desired burst length. That is, not every column address is output in the TCA[0:7] signal. Instead, only the addresses for the first column in each group is provided. Thus, for a burst length of eight, the addresses for columns 0, 8, 16, and so on will be output from column test address sequencer 14 in the TCA[0:7] signal. More details for such a burst operation are shown and described with reference to FIG. 15.

The use of test data signals (TDQ[0:7], or simply TD[0:7]) to load information for an initial row or column address, and least significant bits for the same, is advantageous in that the same circuitry is used for multiple purposes. That is, the bond pads 216 and buffers 222 which handle test data TD signals are also used for loading information that is used to generate addresses. This saves space in the chip on which system 10 is implemented.

A portion (up to all) of the input signals for row test address sequencer 12 and column test address sequencer 14 may be provided from circuitry on the same or a separate integrated circuit chip. For example, in one embodiment, the TD[0:7] signal may be provided from a data output circuit or an external testing output circuit, such as described in related U.S. application Ser. No. 09/967,389 filed on Sep. 28, 2001, entitled "Testing Of Integrated Circuit Devices" and incorporated herein by reference in its entirety.

The test row address (TRA[0:11]) and test column address (TCA[0:7]) signals can each convey sequences of addresses for testing of the memory chip. With these signals, the cells of a memory array in the integrated circuit chip can be addressed according to incrementing/decrementing rows and columns starting from any particular row/column address and in a variety of steps (1, 2, 4, 8, etc.). As such, system 10 provides significant flexibility in testing of the integrated circuit memory.

In operation, for each of row test address sequencer 12 and column test address sequencer 14, information for a respective starting or initial number (which can be for a row address or column address) is loaded via the TD[0:7] signal. This initial number for row test address sequencer 12 can be for an initial row address. The initial number for column test address sequencer 14 can be for an initial column address. Information for a least significant bit (LSB) for each initial number is provided by TD[0:7] signal and the SRLSB1, SRLSB2, and SCLSB signals. The setting of the LSB controls the size of increments/decrements as counting proceeds from the initial numbers. The CRNTD and the CCNTD signals are applied to the test address sequencers 12 and 14 to make the respective sequencer "count up" or "count down" from the initial number. In one embodiment, if the respective count down signal has a high ("logic 1") value, then the test address sequencer counts up; and if the count down signal has a low ("logic 0") value, then the test address sequencer counts down. After the appropriate information is loaded into each of row test address sequencer 12 and column test address sequencer 14, the generation of the test row addresses and test column addresses is initiated by application of, for example, the start test counter (TCNT) signal.

For any initial number and setting for LSB, the same group of addresses will be generated. As between different initial numbers and settings for LSB, only the order or sequence of addresses will differ when row test address sequencer 12 or column test address sequencer 14 is counting.

Thus, for example, assume for simplicity that there are only eight addresses which are defined by some combination of three address bits (A0, A1, A2). If the initial address is selected to be defined by A0=0, A1=0, and A2=0, A0 is selected to be the LSB, and direction of counting is set to count up, then the resultant sequence is as

| A2 | A1 | A0 |
|----|----|----|
| 0  | 0  | 0  |
| 0  | 0  | 1  |
| 0  | 1  | 0  |
| 0  | 1  | 1  |
| 1  | 0  | 0  |
| 1  | 0  | 1  |
| 1  | 1  | 0  |
| 1  | 1  | 1  |

As another example, if the initial address is selected to be defined by A0=0, A1=1, and A2=1, A1 is selected to be the LSB, and direction of counting is set to count down, then the resultant sequence is as follows:

| A2 | A1 | A0 |
|----|----|----|
| 1  | 1  | 0  |
| 1  | 0  | 0  |
| 0  | 1  | 0  |
| 0  | 0  | 0  |
| 1  | 1  | 1  |
| 1  | 0  | 1  |
| 0  | 1  | 1  |
| 0  | 0  | 1  |

As yet another example, if the initial address is selected to be defined by A0=1, A1=1, and A2=0, A2 is selected to be the LSB, and direction of counting is set to count up, then the resultant sequence is as follows:

| A2 | A1 | A0 |
|----|----|----|
| 0  | 1  | 1  |
| 1  | 1  | 1  |
| 0  | 0  | 0  |
| 1  | 0  | 0  |
| 0  | 0  | 1  |
| 1  | 0  | 1  |
| 0  | 1  | 0  |
| 1  | 1  | 0  |

Figure 5A:
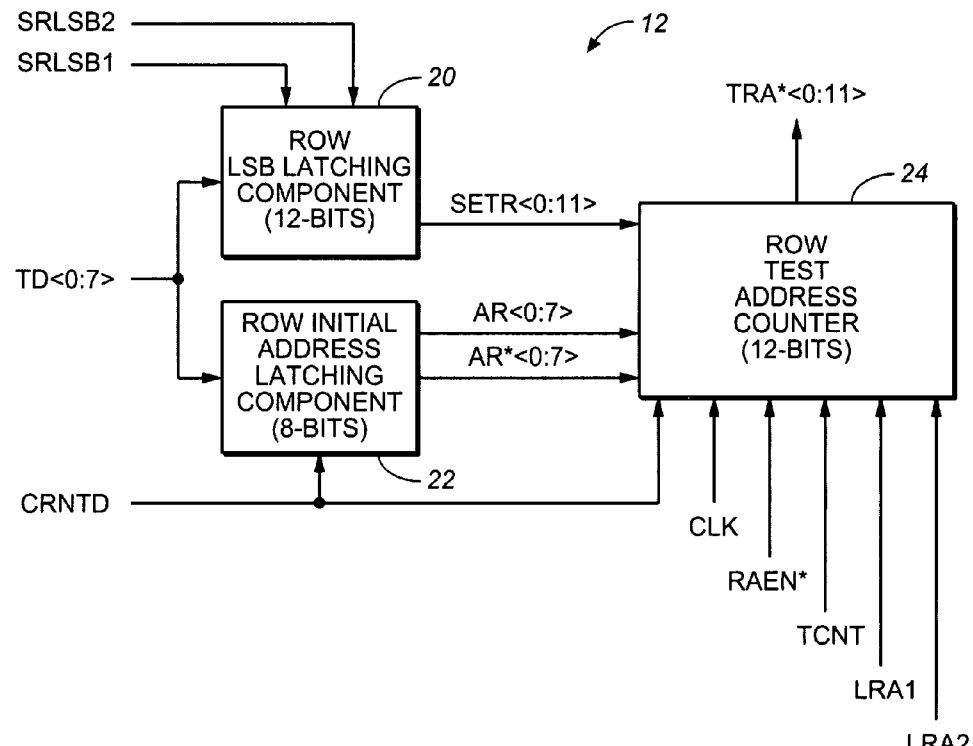
FIGS. 5A and 5B are block diagrams of exemplary implementations for a test row address sequencer, according to embodiments of the present invention.
Figure 5B:
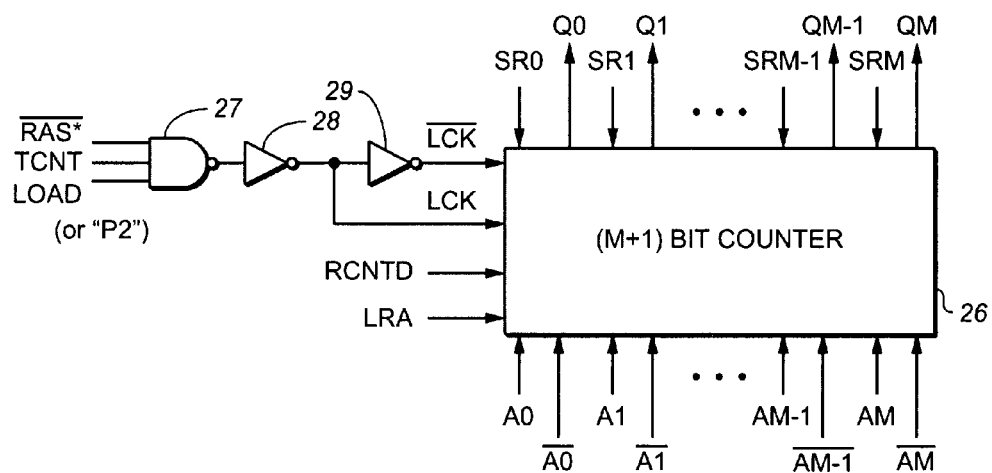

FIGS. 5A and 5B are block diagrams of exemplary implementations for a test row address sequencer 12, according to embodiments of the present invention. It should be understood that the implementations depicted in FIGS. 5A and 5B are merely exemplary and that other implementations are contemplated, would be understood by those of ordinary skill, and are within the scope of present invention.

Referring to FIG. 5A, one implementation for test row address sequencer 12 includes a row address least significant bit (LSB) latching component 20, a row initial address latching component 22, and a row test address counter 24.

Row initial address latching component 22 generally function to latch values of the TD[0:7] signal, which are used to define a starting or initial number (or row address) from which counting may proceed. In one embodiment, this initial number can be a 12-bit binary number (address). Row initial address latching component 22, which may comprise one or more latching elements, receives the CRNTD signal and outputs address (AR[0:7] and AR*[0:7]) signals. These address signals specify the address for an initial row from which counting begins.

Row LSB latching component 20 generally function to latch values of the TD[0:7] signal, which are used to define a least significant bit for counting. The SRLSB2 and SRLSB1 signals are used to set the LSB for row address counting. Row LSB latching component 20 outputs a set (SETR[0:11]) signal. The SETR[0:11] signal serves to determine which bit in a row test address counter 24 will be used as the least significant bit (LSB) during the count.

The Row LSB latching component 20 and row initial address latching component 22 may be separately loaded using the same set of buffers.

Row test address counter 24 is connected to latching components 20 and 22. As used herein, the terms "couple," "connected," or any variant thereof means any coupling or connection, either direct or indirect, between two or more elements. Row test address counter 24 uses the SETR[0:11] and the AR[0:7], AR*[0:7] signals from latches 20 and 22 to generate the TRA [0:11] signals, which is then provided to address buffers. Row test address counter 24 generally functions to "count" a series of row addresses for testing.

Referring to FIG. 5B, another implementation for test row address sequencer 12 includes (M+1) bit counter 26, a NAND gate 27, and inverters 28, 29. Although not explicitly shown, this implementation may also include a row LSB latching component and a row initial address latching component.

The row LSB latching component provides M+1 number of set row (SR) signals (i.e., SR[0:M], or SR0, SR1, ..., SRM) to counter 26 for setting the least significant bit (LSB). The row initial address latching component provides M+1 number of initial row address (A) signals (i.e., A[0:M], or A0, A1, ..., AM) to counter 26 for setting initial row address. That is, these signals provide information for an M+1 bit row address which may be used as the initial row address.

NAND gate 27 receives command signals such as, for example, row address strobe (RAS), start test counter (TCNT), and LOAD. NAND gate 27 outputs a local counter clock (LCK) signal. Counter 26 receives the LCK signal and other command signals, such as row count down (RCNTD) and load row address (LRA). Counter 26 also receives address (A[0:M]) signals from the row initial address latching component and the set row (SR[0:M]) signals from the row LSB latching component.

In operation, upon activation of the load row address (LRA) signal, an initial address is loaded into counter 26 through address (A[0:M]) signals. The LSB is set using the set row (SR[0:M]) signals. The LCK signal causes the counter 26 to begin counting. The direction of counting (either incrementing or decrementing) is controlled by the row count down (RCNTD) signal. Counter 26 outputs M+1 number of output (Q) signals (i.e., Q[0:M], or Q0, Q1, ..., QM) which may be used for row addresses for testing various locations in a semiconductor chip on which counter 26 is contained (e.g., chip 204).

Figure 14:
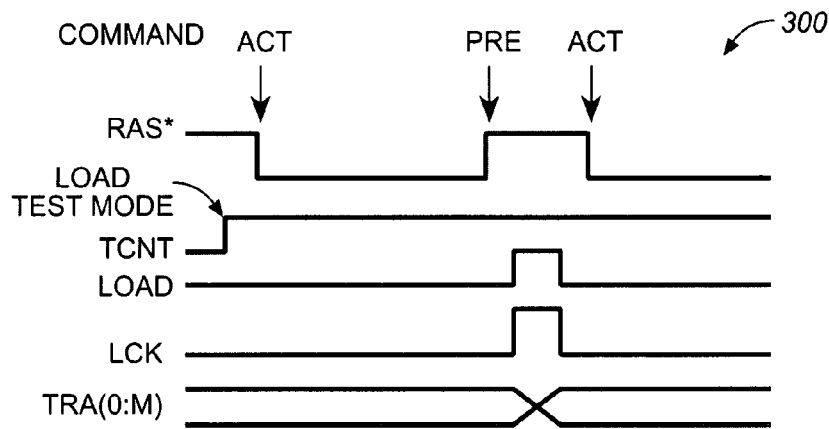
FIG. 14 is an exemplary timing diagram for test row address sequencer, according to an embodiment of the invention.

An exemplary timing diagram 300 for this implementation of a test row address sequencer 12 is shown in FIG. 14.

Figure 6A:
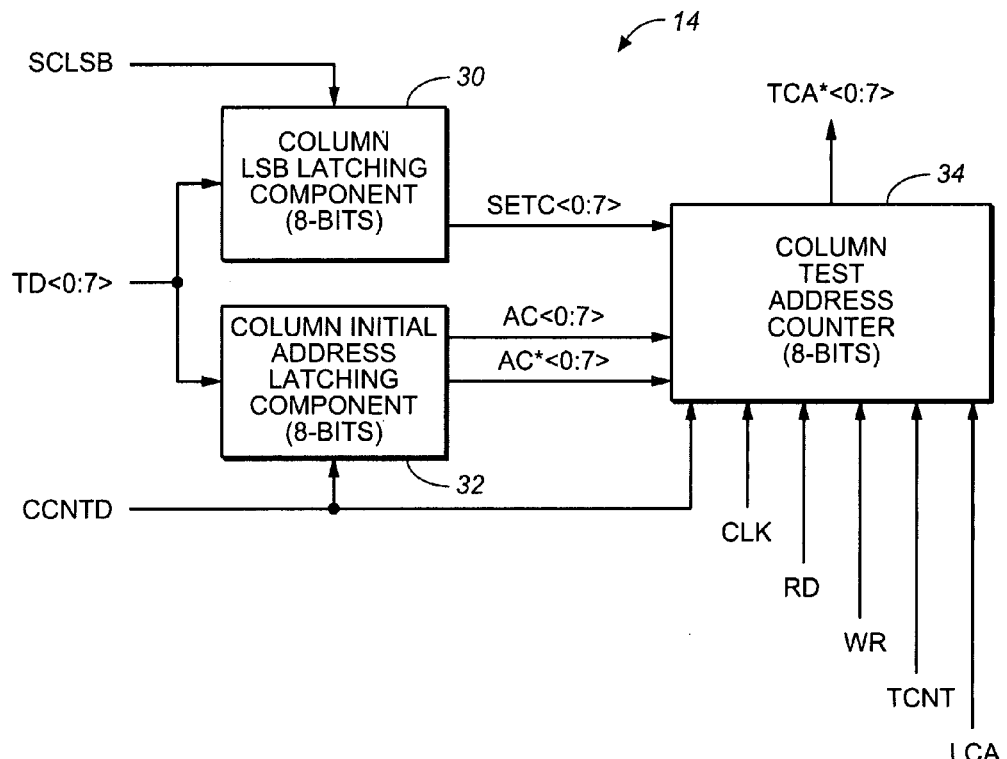
FIGS. 6A and 6B are block diagrams of exemplary implementations for a test column address sequencer, according to embodiments of the present invention.
Figure 6B:
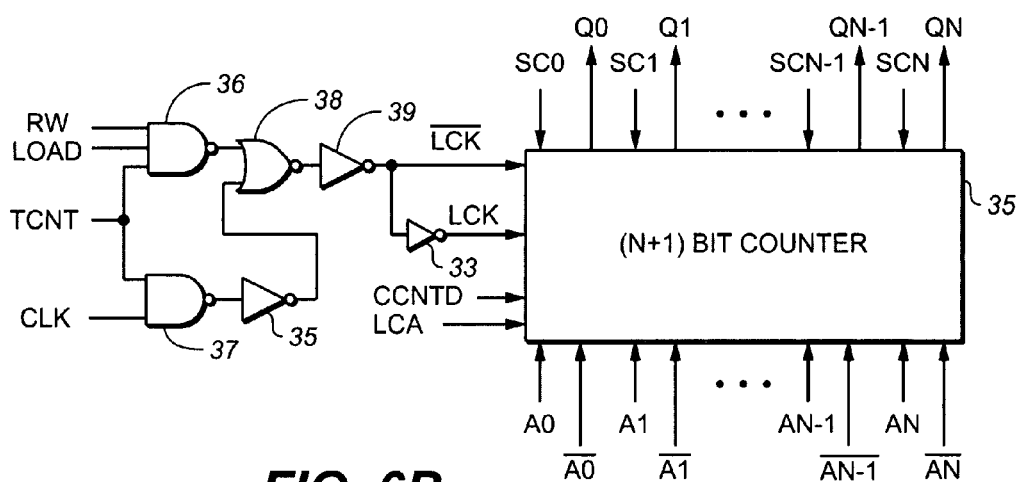

FIGS. 6A and 6B are block diagrams of exemplary implementations for a test column address sequencer 14, according to embodiments of the present invention. It should be understood that the implementations depicted in FIGS. 6A and 6B are merely exemplary and that other implementations are contemplated, would be understood by those of ordinary skill, and are within the scope of present invention.

Referring to FIG. 6A, one implementation for test column address sequencer 142 includes a column least significant bit (LSB) latching component 30, a column initial address latching component 32, and a column test address counter 34.

Column initial address latching component 32 generally function to latch values of the TD[0:7] signal, which are used to define a starting or initial number (or column address) from which counting may proceed. In one embodiment, this initial number can be an 8-bit binary number (address). Column initial address latching component 32, which may comprise one or more latching elements, receives the CCNTD signal and outputs address (AC[0:7] and AC*[0:7]) signals. These address signals specify the address for an initial column from which counting begins.

Column LSB latching component 30 generally function to latch values of the TD[0:7] signal, which are used to define a least significant bit for counting. The SCLSB signal is used to set the LSB for column address counting. Column LSB latching component 20 outputs a set (SETC[0:7]) signal. The SETC[0:7] signal serves to determine which bit in the column test address counter 34 will be used as the least significant bit (LSB) during the count.

Column test address counter 34 is connected to latching components 30 and 32. Column test address counter 34 uses the SETC[0:11] and the AC[0:7], AC*[0:7] signals from latching components 30 and 32 to generate the TCA [0:7] signal, which is then provided to address buffers. Column test address counter 34 generally functions to "count" a series of columns addresses for testing.

The column LSB latching component 30 and column initial address latching component 32 may be separately loaded using the same set of buffers.

Referring to FIG. 6B, another implementation for test column address sequencer 14 includes (N+1) bit counter 35, NAND gates 36, 37, NOR gate 38, and inverters 33, 35, and 39. Although not explicitly shown, this implementation may also include a column LSB latching component and a column initial address latching component.

The column LSB latching component provides N+1 number of set column (SC) signals (i.e., SC[0:N], or SC0, SC1, . . . , SCN) to counter 35 for setting the least significant bit (LSB). The column initial address latching component provides N+1 number of initial column address (A) signals (i.e., A[0:N], or A0, A1, . . . , AN) to counter 35 for setting initial column address. That is, these signals provide information for an N+1 bit column address which may be used as the initial column address.

NAND gates 36 and 37 receive command signals such as, for example, RW, LOAD, start test counter (TCNT), and clock (CLK). A local counter clock (LCK) signal is generated from these signals. Counter 35 receives the LCK signal and other command signals, such as column count down (CCNTD) and load column address (LCA). Counter 35 also receives address (A[0:N]) signals from the column initial address latching component and the set column (SC[0:N]) from the column LSB latching component.

In operation, upon activation of the load column address (LCA) signal, an initial address is loaded into counter 35 through address (A[0:N]) signals. The LSB is set using the set row (SC[0:N]) signals. The LCK signal causes the counter 35 to begin counting. The direction of counting (either incrementing or decrementing) is controlled by the column count down (CCNTD) signal. Counter 35 outputs N+1 number of output (Q) signals (i.e., Q[0:N], or Q0, Q1, . . . , QN) which may be used for column addresses for testing various locations in a semiconductor chip on which counter 35 is contained (e.g., chip 204).

Figure 7A:
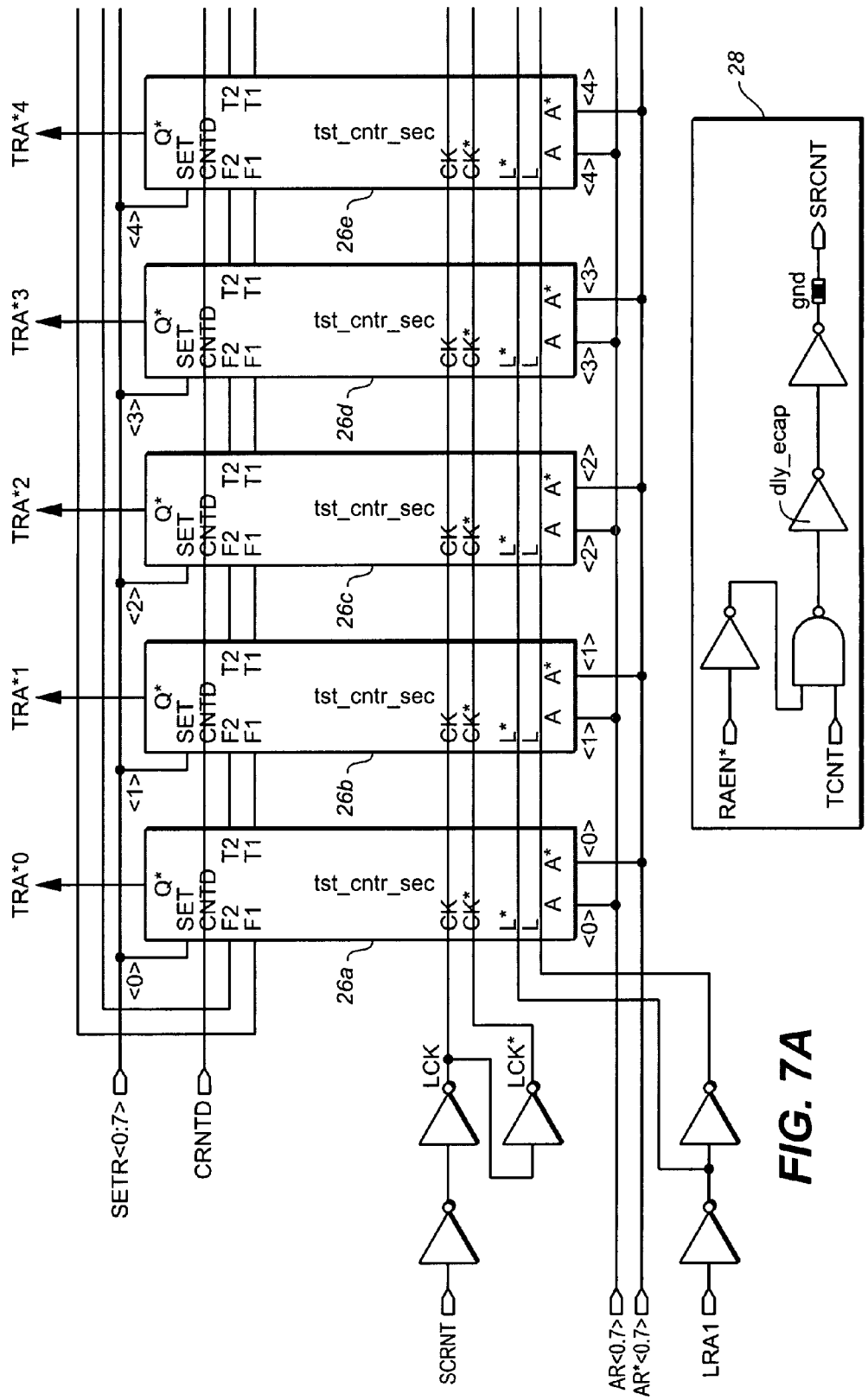
FIG. 7 is a schematic diagram for a row test address counter, according to an embodiment of the present invention.
Figure 7B:
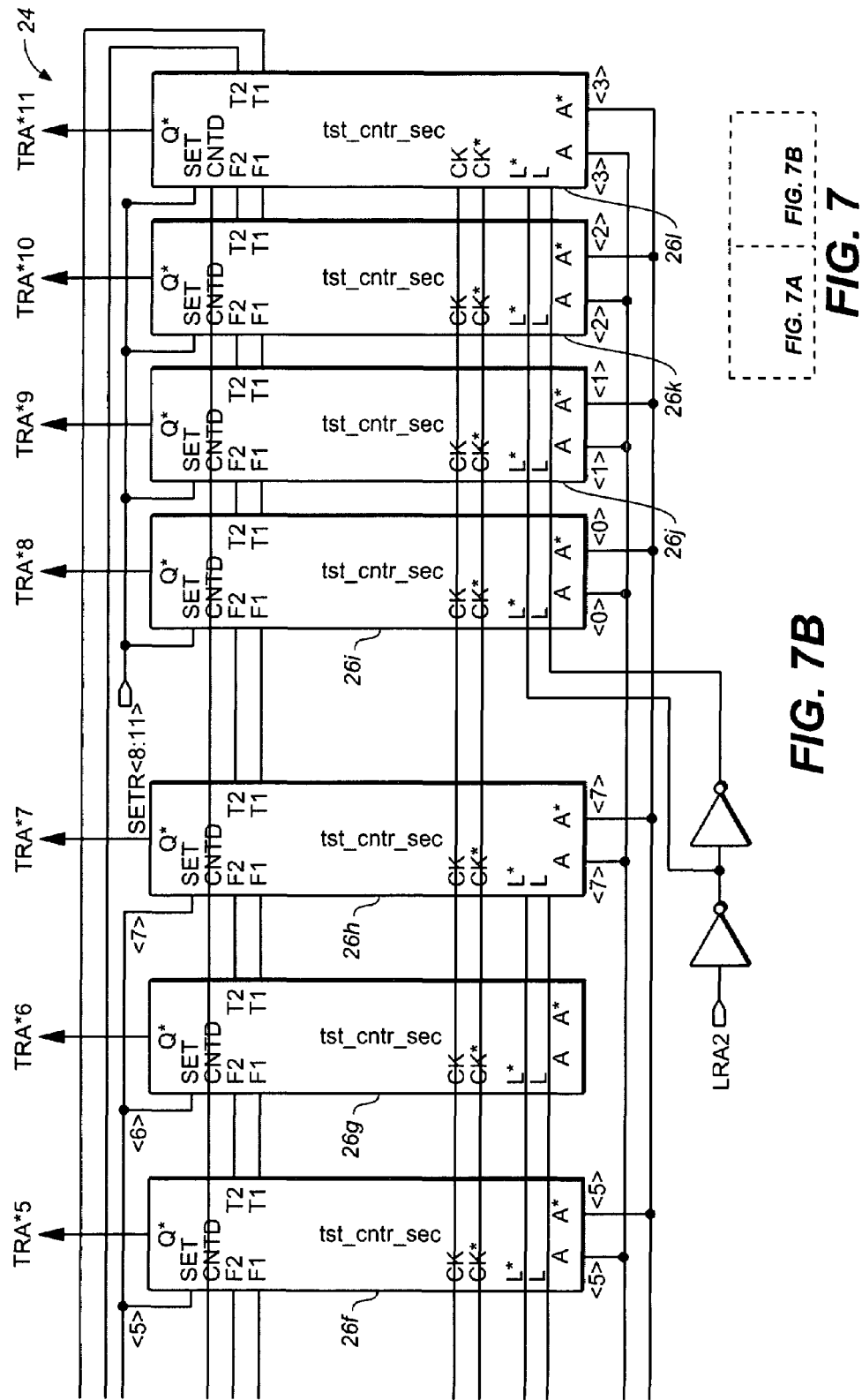

FIG. 7 is a schematic diagram for a row test address counter 24, according to an embodiment of the present invention. It should be understood that the implementation depicted in FIG. 7 is merely exemplary and that other implementations are contemplated, would be understood by those of ordinary skill, and are within the scope of present invention.

Row test address counter 24 may include a number of test counter sections (tst_cntr_sec) 26, which are separately labeled 26a–l. Test counter sections 26 may be coupled serially or in cascode in order to implement a counter. That is, one or more output signals (T1, T2) of one test counter section 26 are applied as input signals (F1, F2) to the next section 26. A first group of test counter sections 26a–h are connected to receive a respective one of the row address bit signals (AR[0:7] and/or AR*[0:7]), in response to the application of the LRA1 signal. A second group of test counter sections 26i–l are connected to receive a respective one of the row address bit signals (AR[0:7] and/or AR*[0:7]), in response to the application of the LRA2 signal. In other words, the LRA1 and LRA2 signals are applied to test counter sections 26a–l in order to load the initial address from row initial address latching component 22.

In one embodiment, two cycles (e.g., of a CLK signal) may be required to set up row test address sequencer 12. In a first cycle, the first group of test counter sections 26a–h are loaded with respective values for an initial row address and a least significant bit; and in a second cycle, the second group of test counter sections 26i–l are loaded with respective values for the initial row address and the least significant bit.

Each test counter section 26a–l receives the CRNTD signal and a respective one of the SETR[0:11] signals. The SETR[0:11] signals generally function to specify one of the bits stored in one of test counter sections 26 as the least significant bit (LSB) so that counting proceeds in increments of 1, 2, 4, 8, etc. Test counter section 26a–l collectively output a sequence numbers, which can be row addresses conveyed in the output TRA[0:1] signals (appearing at the Q* output terminals of the test counter sections). The TRA[0:11] signals may be conveyed to the periphery circuitry of a memory array for access of particular rows during testing.

In the depicted embodiment, row test address counter 24 may be a synchronous counter, which is timed with a suitable clock signal. In particular, the signals at Q/Q* output terminals switch at substantially the same time when a LCK or LCK* signal goes, for example, active high. A shift register count generator 28, which receives the RAEN and TCNT signals, generates a start row count (SRCNT) signal. The SRCNT signal is used to generate the LCK and a LCK* signals. The LCK and LCK* signals are applied to clock inputs of the test counter sections 26a–l, thus causing the test address counter 24 to output a sequence of row addresses conveyed in the TRA[0:11] signals.

Figure 8A:
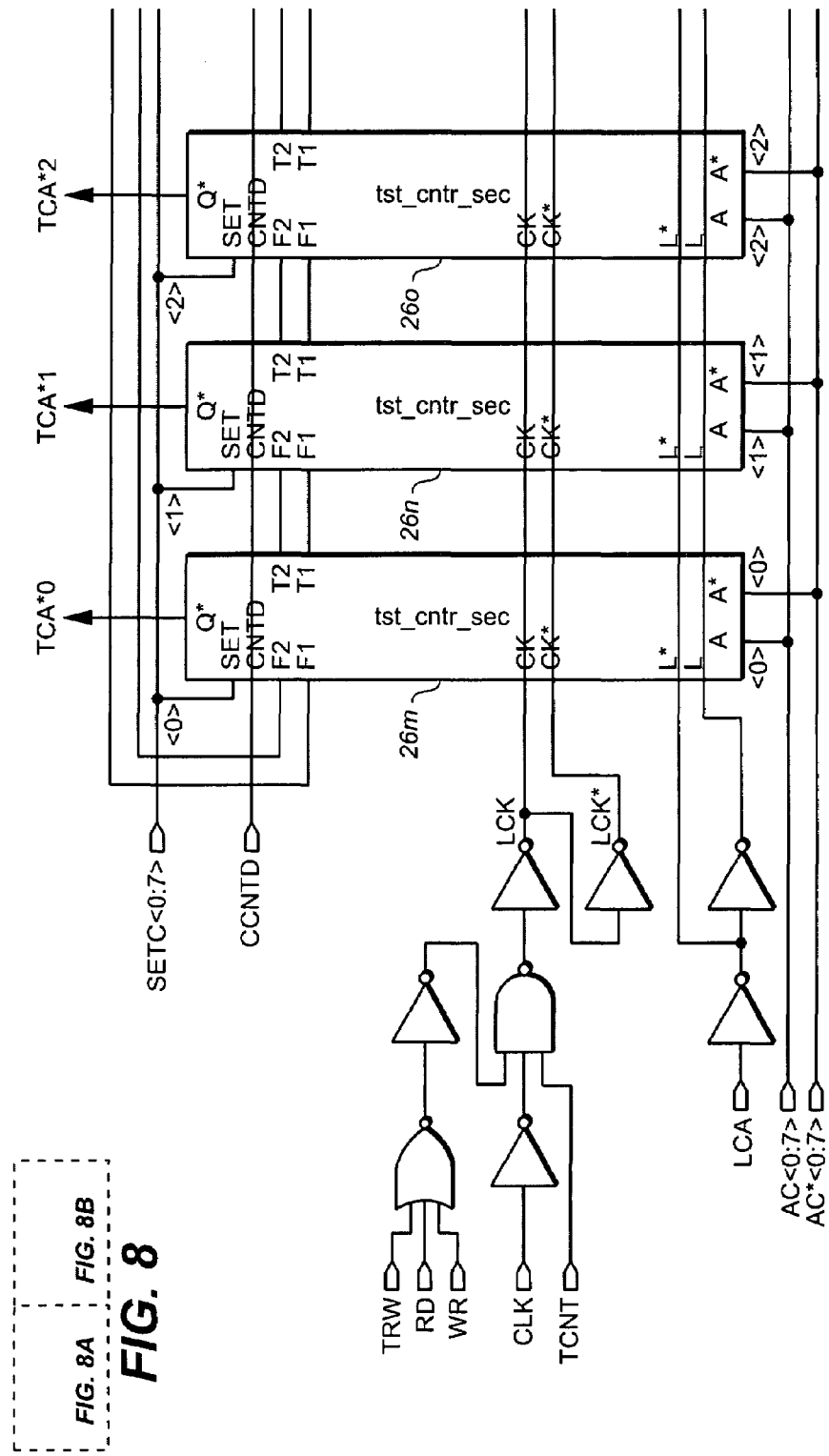
FIG. 8 is a schematic diagram for a column test address counter, according to an embodiment of the present invention.
Figure 8B:
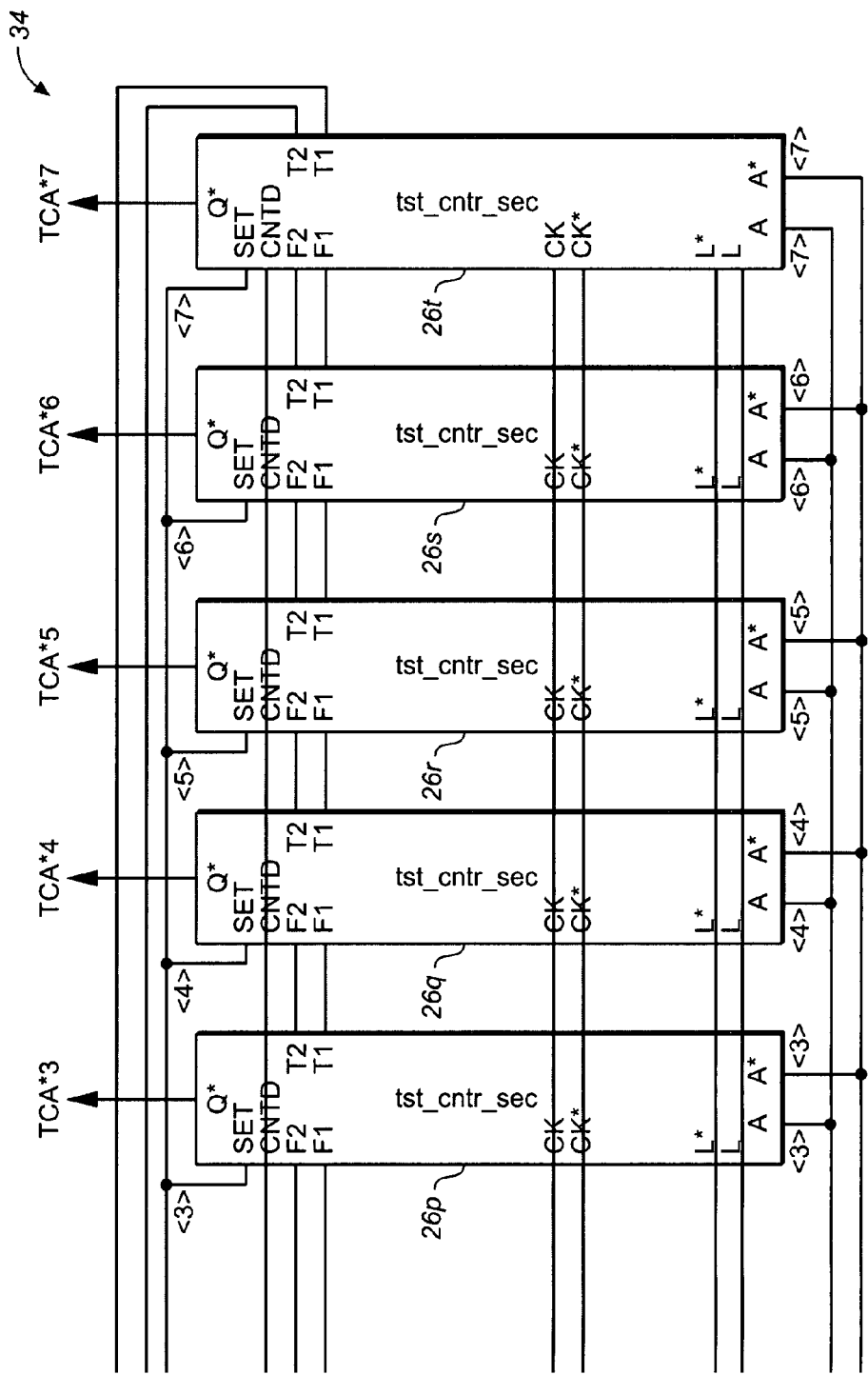

FIG. 8 is a schematic diagram for a column test address counter 34, according to an embodiment of the present invention. It should be understood that the implementation depicted in FIG. 8 is merely exemplary and that other implementations are contemplated, would be understood by those of ordinary skill, and are within the scope of present invention.

Column test address counter 34 may include a number of test counter sections (tst_cntr_sec) 26, which are separately labeled 26m–s. Test counter sections 26m–s may be coupled serially or in cascode in order to implement a counter. More specifically, one or more output signals (T1, T2) of one test counter section 26 are applied as input signals (F1, F2) to the next section 26. Test counter sections 26m–s are connected to receive a respective one of the column address signals (AC[0:7] and/or AC[0:7]), in response to the application of the LCA signal.

Each test counter section 26m–s receives the CCNTD signal and a respective one of the SETC[0:7] signals. The SETC[0:7] signals generally function to specify one of the bits stored in one of test counter sections 26 as the least significant bit (LSB) so that counting proceeds in increments of 1, 2, 4, 8, etc. Test counter sections 26m–s collectively output a sequence numbers, which can be column addresses conveyed in the output TCA[0:7] signals (appearing at Q* output terminals of the test counter sections). The TCA[0:7] signals may be conveyed to the periphery circuitry of a memory array for access of particular columns during testing. In one embodiment, test counter sections 26m–s may be loaded with respective values for an initial column address and a least significant bit (which, for a synchronous design, can be accomplished in a single clock cycle).

In the depicted embodiment, column test address counter 34 may be a synchronous counter, which is timed with a suitable clock signal. In particular, the signals at Q/Q* output terminals switch at substantially the same time when a LCK or LCK* signal goes, for example, active high. The TCNT signal is used to generate the LCK and a LCK* signals. The LCK and LCK* signals are applied to clock inputs of the test counter sections 26m–s, thereby causing the test address counter 34 to output a sequence of column addresses conveyed in the TCA[0:7] signals.

Figure 9:
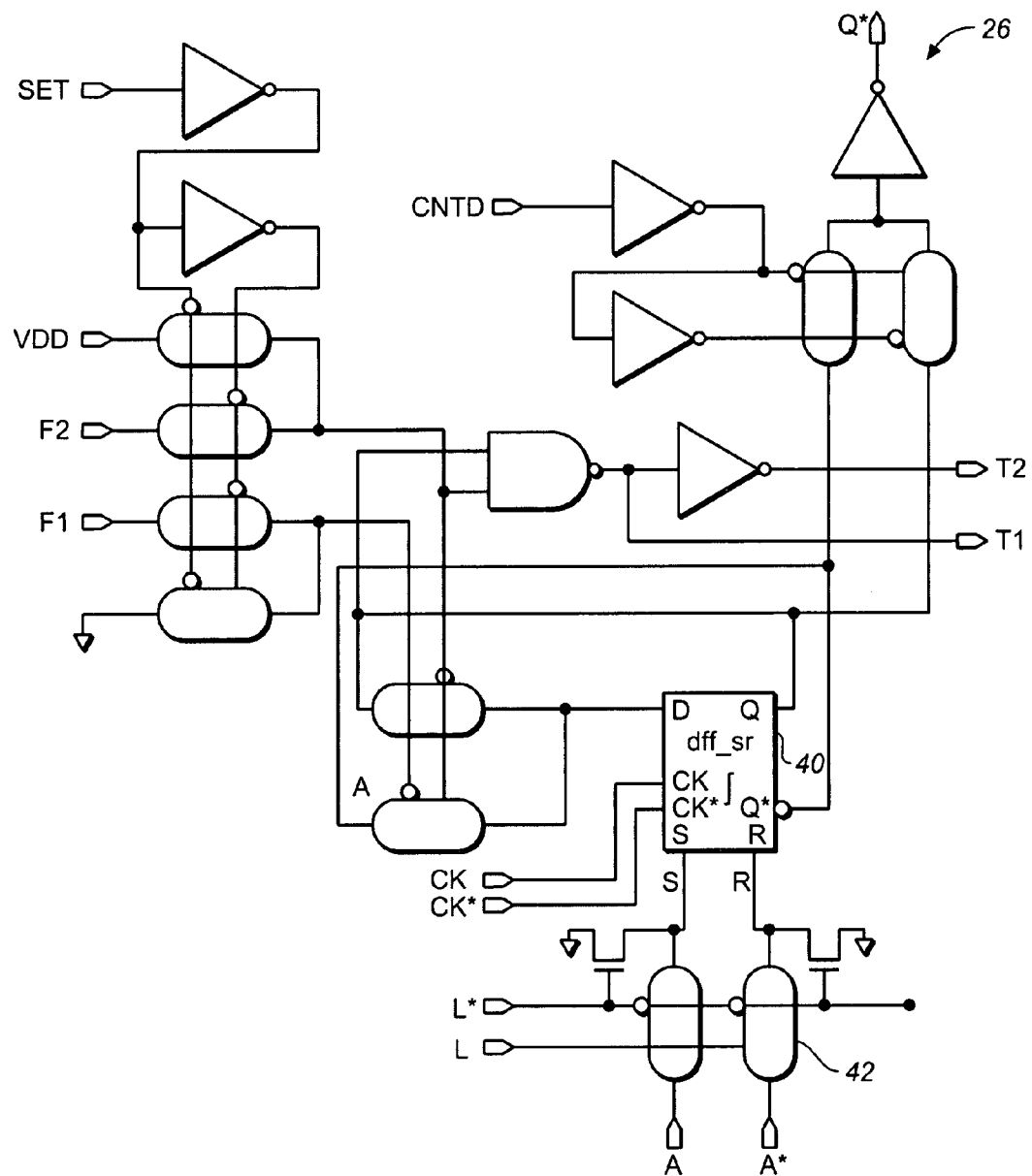
FIG. 9 is a schematic diagram for a test counter section, according to an embodiment of the present invention.

FIG. 9 is a schematic diagram for a test counter section 26, according to an embodiment of the present invention. It should be understood that the implementation depicted in FIG. 9 is merely exemplary and that other implementations are contemplated, would be understood by those of ordinary skill, and are within the scope of present invention. Test counter section 26 cooperates with other test counter sections 26 to count in set increments or decrements from some initial value that may be loaded into the test counter sections 26.

As shown, test counter section 26 has an input node SET to receive a bit signal (SETR[i], SETC[i]), input nodes A, A* to receive bit signals (AR[i], AR[i]; AC[i], AC[i]) for an initial address (row or column), an input node CNTD to receive a countdown (CRNTD, CCNTD) signal, input nodes F1, F2 to receive signals from a another test counter section 26 to which it is connected, input nodes CK, CK* to receive clock (LCK, LCK*) signals, and input nodes L, L* to receive the load row address (or load column address) signals.

Test counter section 26 may include a flip-flop 40, which may form part of a shift register. In one embodiment, this flip-flop 40 can be a positive-edge-triggered D set-reset flip-flop (dff_sr). The address bit signals (AR[i], AR[i]; AC[i], AC[i]) may be applied to the set (S) and reset (R) inputs of flip-flop 40 through pass gates 42 (only one of which is labeled for clarity), depending on the values of the load address (LRA or LCA) signals. This allows a respective bit of an initial address to be set in the test counter section 26. Either of the output Q, Q* signals of the flip-flop 40 may be used for the respective output address bit signal (TRA[i] or TCA[i]) of the test counter section 26, depending on whether the test address counter is counting up or counting down. The value of the input signal (CRNTD or CCNTD) at the CNTD node will be low ("logic 0") if the test address counter is counting up, and the value of the signal at the CNTD node will be high ("logic 1") if the test address counter is counting down.

The output Q, Q* signals of the flip-flop 40 may also be fed back as input at the D input, depending on the values of the signals at F1, F2 and SET nodes of the test counter section 26. If it is desired that the bit value for test counter section 26 be the least significant bit for counting, then the value of the signal (SETR[i] or SETC[i]) at the SET input node will be high, and the Q* signals will be fed back to the D input. Otherwise, depending on the voltage values of F1 and F2 signals, either Q or Q* signals will be fed back to the D input. Note that the F1 and F2 signals may always be complements of each other. The test counter section 26 performs logic on the F2 signal to generate the T1, T2 signals, which may be output to another test counter section 26.

Figure 10:
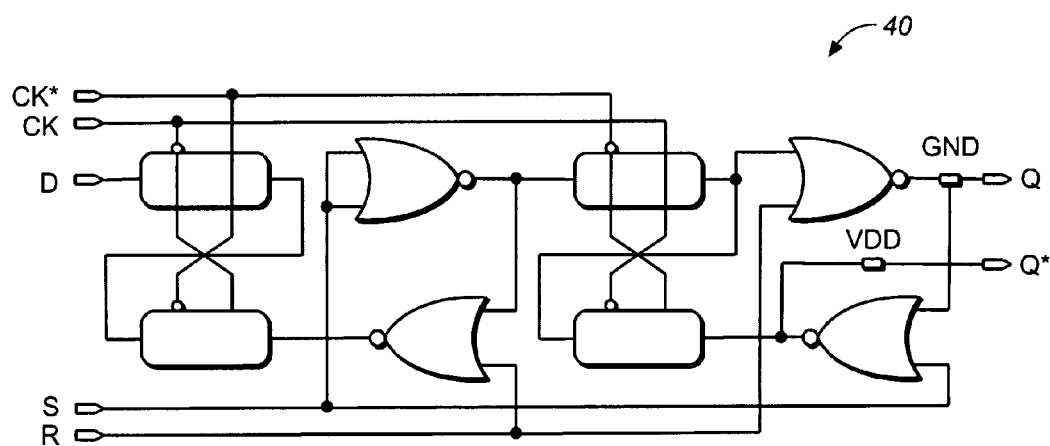
FIG. 10 is a schematic diagram of one implementation for a flip-flop.
Figure 13:
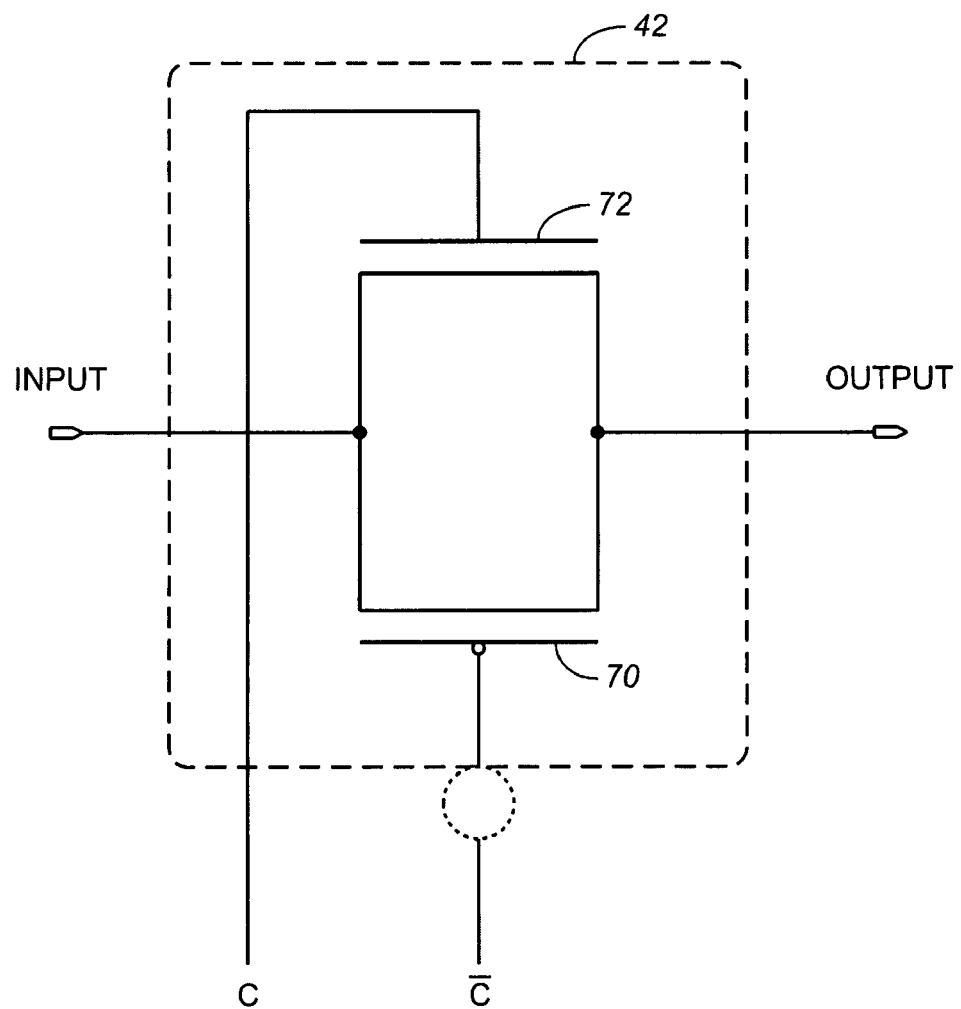
FIG. 13 is a schematic diagram of one implementation for a pass gate.

A schematic diagram of an exemplary implementation for flip flop 40, according to an embodiment of the present invention, is shown in FIG. 10. A schematic diagram of an exemplary implementation for pass gate 42 is shown in FIG. 13.

FIGS. 11A and 11B are schematic diagrams of exemplary implementations for a set address latch 50, according to embodiments of the present invention. It should be understood that the implementations depicted in FIGS. 11A and 11B are merely exemplary and that other implementations are contemplated, would be understood by those of ordinary skill, and are within the scope of present invention.

A plurality of such initial address latches 50 may be used for implementing row initial address latching component 22 and column initial address latching component 32 (shown, for example, in FIGS. 5A and 6A, respectively). In one embodiment, eight such initial address latches may be used for each of row initial address latching component 22 and column initial address latching component 32.

Figure 11:
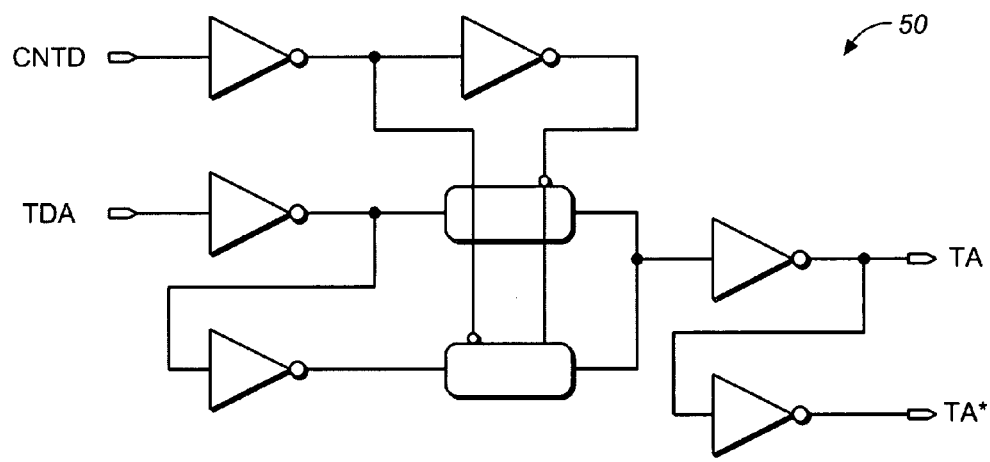
FIG. 11 is a schematic diagrams of exemplary implementations for a set address latch, according to an embodiment of the present invention.

Referring to FIG. 11, in one implementation initial address latch 50 receives the appropriate count down signal (CRNTD or CCNTD) at a CNTD node, and a respective test data (TD[i]) bit signal at a TDA node. Initial address latch 50 generally functions to latch the value of the respective test data bit signal for input into a test address counter as part of an initial address.

Figure 12A:
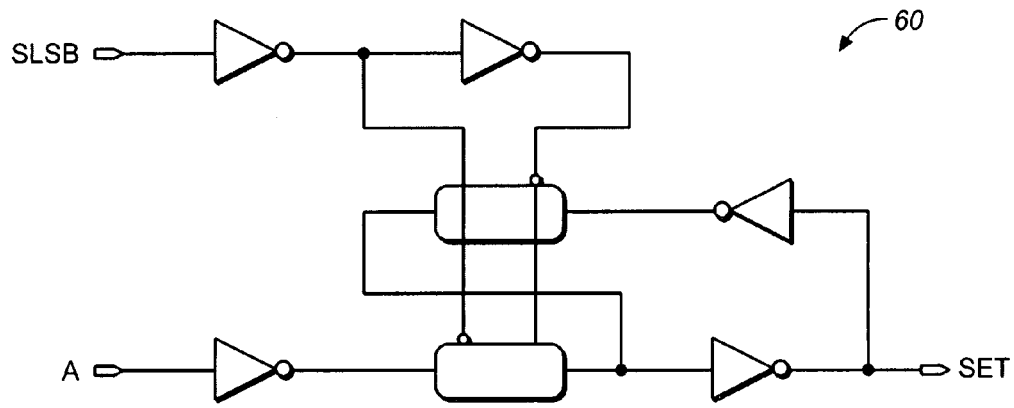
FIGS. 12A, 12B, and 12C are schematic diagrams of exemplary implementations for a set least significant bit latch, according to embodiments of the present invention.
Figure 12B:
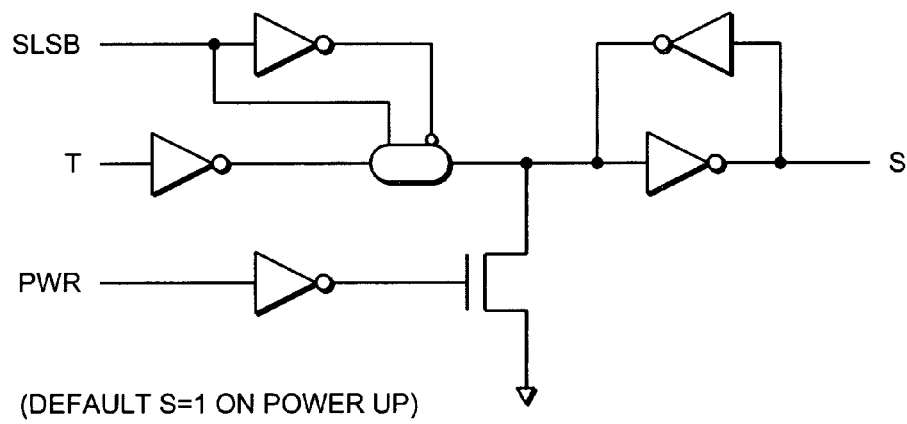
Figure 12C:
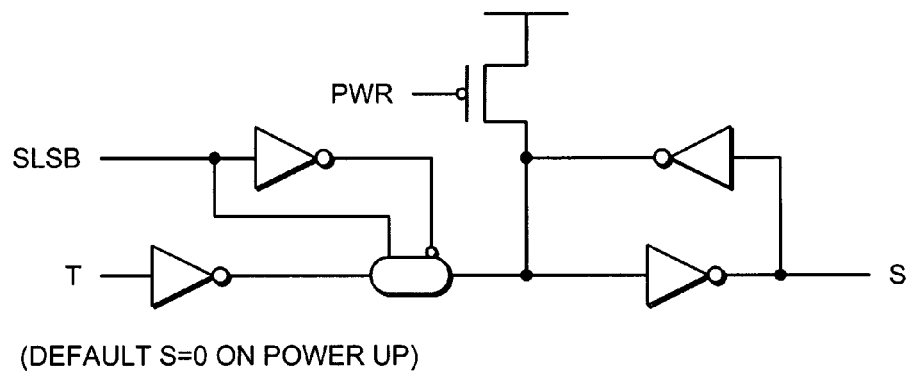

FIGS. 12A, 12B, and 12C are schematic diagrams of exemplary implementations for a set least significant bit latch 60, according to embodiments of the present invention. It should be understood that the implementations depicted in FIGS. 12A, 12B, and 12C are merely exemplary and that other implementations are contemplated, would be understood by those of ordinary skill, and are within the scope of present invention.

A plurality of such LSB latches 60 may be used for implementing a row LSB latching component or a column LSB latching component (such as row LSB latching component 20 or column LSB latching component 30 shown in FIGS. 5A and 6A, respectively).

Referring to FIG. 12A, a schematic diagram of one implementation for LSB latch 60 is provided. In some embodiments, the implementation for LSB latch 60 shown in FIG. 12A may be used for row LSB latching component 20 (shown in FIG. 5A) and the column LSB latching component 30 (shown in FIG. 6A). In one embodiment, twelve such LSB latches may be used for row LSB latching component 20, and eight such LSB latches may be used for column LSB latching component 30.

Each LSB latch 60 receives the appropriate set LSB signal (SRLSB or SCLSB) at a SLSB node, and a respective test data (TD[i]) bit signal at node A. Each LSB latch 60 generally functions to latch the value of the respective test data bit signal for input into a row test address counter 24 or column test address counter 34 for defining a LSB.

Referring to FIGS. 12B and 12C, other implementations for LSB latch 60 are depicted. Each LSB latch 60 outputs a set (S) signal which is provided to a row counter 26 (see FIG. 5B) or a column counter 35 (see FIG. 6B). For an M+1 bit row counter 26, M+1 LSB latches 60 are provided. Each such LSB latch 60 outputs a respective set row (SR) signal (i.e., SR[0:M], or SR0, SR1, . . . , SRM) for setting a LSB in the row counter 26. For an N+1 bit column counter 35, N+1 LSB latches 60 are provided. Each such LSB latch 60 outputs a respective set column (SC) signal (i.e., SC[0:N], or SC0, SC1, . . . , SCN) for setting a LSB in the column counter 35.

The implementations depicted in FIGS. 12B and 12C are used in the alternative depending on default value for the set (S) signal at power up. In particular, the implementation shown in FIG. 12B may be used when the default for the set S signal is a high value or "1" on power up. The implementation shown in FIG. 12C may be used when the default for the set S signal is a low value or "0" on power up.

FIG. 13 illustrates an exemplary implementation for a pass gate 42 which is shown, for example, in FIGS. 9 through 12C. As shown, pass gate 42 comprises a P-type transistor 70 and an N-type transistor 72 with their sources and drains coupled together. An enable signal C is applied to the gate of transistor 72, and the inverse of the enable signal C is applied to the gate of transistor 70. An input terminal of pass gate 42 receives an input signal, and an output signal appears at an output terminal for pass gate 42. In operation, when the value of the enable C is low (and, consequently, the value of the inverse of the enable signal is high), the value of the input signal is passed through pass gate 42 as the value of the output signal.

Figure 15:
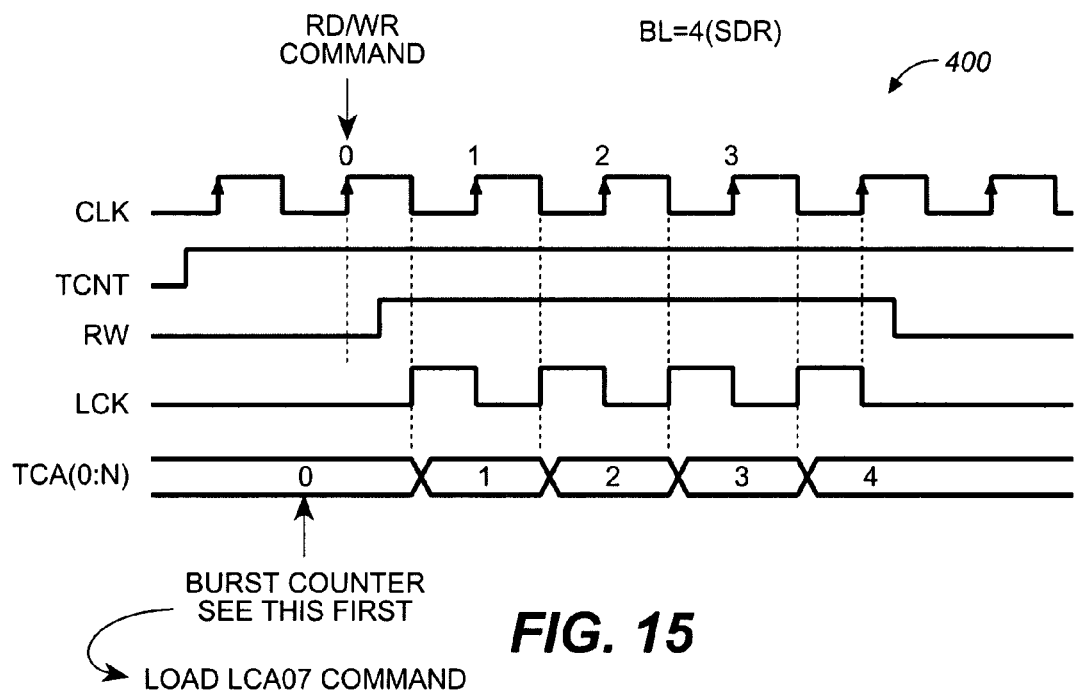
FIG. 15 is an exemplary timing diagram for a simulated burst operation, according to an embodiment of the invention.

FIG. 15 is a an exemplary timing diagram 400 for a simulated burst operation, according to an embodiment of the invention. In a burst operation, the data at a plurality of sequential column addresses are accessed in response to a single read (RD) or write (WR) command, thus enabling more rapid access of data. Only the address of the first column in the group is needed. The systems and methods, according to embodiments of the invention, may generate and output column addresses to simulate burst operation.

Referring to FIG. 15, an initial column address is loaded into the column test address sequencer 14. With the start test counter (TCNT) signal activated, the initial column address is output by column test address sequencer 14 in the test column address (TCA[0:N]) signal when the read (RD) or write (WR) signal is applied. The initial column address (e.g., 0) is used to access data at a group of sequential column addresses. This could be, for example, column addresses 0 through 3 for a burst length of four.

The column test address sequencer 14 generates a number of additional column addresses. But not all of these column addresses are output in the test column address (TCA[0:N]) signal. Only the starting address for each group of columns is provided. Thus, continuing with the example given immediately above, the next column address output from column test address sequencer 14 will be 4 (for column addresses 4 through 7), and then 8 (for column addresses 8 through 11), and so on. This simulates a burst operation for testing of an integrated circuit (IC) chip.

The burst length—corresponding to the number of addresses which are generated and output in response to a single application of the read (RD) or write (WR) signal—can be configurable to match the actual operation of the IC chip.

Although the present invention and its advantages have been described in detail, it should be understood that various changes, substitutions, and alterations can be made therein without departing from the spirit and scope of the invention as defined by the appended claims. That is, the discussion included in this application is intended to serve as a basic description. It should be understood that the specific discussion may not explicitly describe all embodiments possible; many alternatives are implicit. It also may not fully explain the generic nature of the invention and may not explicitly show how each feature or element can actually be representative of a broader function or of a great variety of alternative or equivalent elements. Again, these are implicitly included in this disclosure. Where the invention is described in device-oriented terminology, each element of the device implicitly performs a function. Neither the description nor the terminology is intended to limit the scope of the claims.

What is claimed is:

1. In a first integrated circuit chip contained in a single package along with a second integrated circuit chip, a system comprising:
   circuitry on the first integrated circuit chip operable to receive address signals from the second integrated circuit chip during normal operation; and
   circuitry on the first integrated circuit chip operable to generate address signals for use in testing the first integrated chip in a test mode.

2. The system of claim 1 wherein the circuitry operable to generate address signals comprises a test address counter coupled to the latching component, the test address counter operable to generate a sequence of addresses, wherein the sequence of addresses is represented by respective values which are derived by incrementing or decrementing from a value for an initial address.

3. The system of claim 2 wherein the circuitry operable to generate address signals comprises a latching component operable to receive and latch the value for the initial address.

4. The system of claim 2 wherein the test address counter comprises a plurality of test counter sections coupled in cascode arrangement.

5. The system of claim 4 wherein the first latching component receives the value for the initial addresses in a plurality of load operations.

6. The system of claim 2 wherein the test address counter is initialized using a SET signal and a LOAD signal.

7. The system of claim 2 wherein the test address counter is started and stopped using a LOAD signal.

8. The system of claim 1 wherein the circuitry operable to generate address signals comprises:
   a first latching component operable to receive and latch a value for an initial address;
   a second latching component operable to receive and latch data for designating a least significant bit; and
   a test address counter coupled to the first latching component and the second latching component, the test address counter operable to generate a sequence of addresses, wherein the sequence of addresses is represented by respective values which are derived by incrementing or decrementing from the value for the initial address at the least significant bit.

9. The system of claim 1 wherein at least some external terminals for the single package are shared by the first and second integrated circuit chips.

10. The system of claim 1 wherein the circuitry operable to receive address signals from the second integrated circuit chip comprises:
a plurality of bond pads connected by respective bond wires to the second integrated circuit chip; and
a plurality of buffers, each buffer connected to a respective one of the plurality of bond pads.

11. The system of claim 1 wherein:
one of the first and the second integrated circuit chips is a memory chip; and
the other of the first and the second integrated circuit chips is a logic chip.

12. The system of claim 1 comprising a multiplexer on the first integrated chip operable to multiplex between the address signals received from the second integrated circuit chip and the address signals generated for use in testing.

13. In a first integrated circuit chip contained in a single package along with a second integrated circuit chip, a method comprising:
receiving at the first integrated circuit chip address signals from the second integrated circuit chip during normal operation; and
internally generating at the first integrated circuit chip address signals for use in testing the first integrated chip in a test mode.

14. The method of claim 13 wherein internally generating comprises generating a sequence of addresses, wherein the sequence of addresses is represented by respective values which are derived by incrementing or decrementing from a value for an initial address.

15. The method of claim 14 wherein generating the sequence of addresses is started and stopped using a LOAD signal.

16. The method of claim 13 wherein internally generating is initialized using a SET signal and a LOAD signal.

17. The method of claim 13 comprising receiving and latching the value for the initial address.

18. The method of claim 17 wherein the value for the initial addresses is received in a plurality of load operations.

19. The method of claim 13 wherein at least some external terminals for the single package are shared by the first and second integrated circuit chips.

20. The method of claim 13 wherein:
one of the first and the second integrated circuit chips is a memory chip; and
the other of the first and the second integrated circuit chips is a logic chip.

21. In a semiconductor device having a first integrated circuit chip and a second integrated circuit chip contained in a single package, wherein the first integrated circuit chip and the second integrated circuit chip share a plurality of external pins of the single package, the first integrated circuit chip comprising:
circuitry operable to receive address signals from the second integrated circuit chip during normal operation for the first integrated circuit chip;
a first latching component operable to receive and latch a value for an initial address in a test mode for the first integrated circuit chip; and
a test address counter coupled to the latching component, the test address counter operable to generate a sequence of addresses in the test mode, wherein the sequence of addresses is represented by respective values which are derived by incrementing or decrementing from a value for an initial address.

22. The first integrated circuit chip of claim 21 comprising a second latching component operable to receive and latch data for designating one of the N address bits as a least significant bit for incrementing or decrementing.

23. The first integrated circuit chip of claim 21 wherein the initial address comprises a plurality of bits and the test address counter comprises a plurality of test counter sections, each test counter section operable to receive one of the bits of the initial address.

24. The first integrated circuit chip of claim 21 wherein the test address counter comprises a plurality of test counter sections coupled in cascode arrangement.

25. The first integrated circuit chip of claim 21 wherein the test address counter comprises N test counter sections, each of the N test counter sections associated with a respective one of the N address bits and operable to generate a separate value for the respective one of the N address bits for each address in the sequence.

26. In a first integrated circuit chip contained in a single package along with a second integrated circuit chip, a system comprising:
means on the first integrated circuit chip for receiving address signals from the second integrated circuit chip during normal operation; and
means on the first integrated circuit chip for generating address signals for use in testing the first integrated chip in a test mode.

27. The system of claim 26 wherein the means for generating address signals comprises a test address counter coupled to the latching component, the test address counter operable to generate a sequence of addresses, wherein the sequence of addresses is represented by respective values which are derived by incrementing or decrementing from a value for an initial address.

28. The system of claim 27 wherein the means for generating address signals comprises a latching component for receiving and latching the value for the initial address.

29. The system of claim 26 wherein the means for generating address signals is initialized using a SET signal and a LOAD signal.

30. The system of claim 26 wherein the means for generating address signals is started and stopped using a LOAD signal.

31. The system of claim 26 wherein at least some external terminals for the single package are shared by the first and second integrated circuit chips.

32. The system of claim 26 wherein:
one of the first and the second integrated circuit chips is a memory chip; and
the other of the first and the second integrated circuit chips is a logic chip.

* * * * *